US006308143B1

(12) United States Patent
Segawa

(10) Patent No.: US 6,308,143 B1
(45) Date of Patent: *Oct. 23, 2001

(54) LAYOUT INPUT APPARATUS, LAYOUT INPUT METHOD, LAYOUT VERIFICATION APPARATUS, AND LAYOUT VERIFICATION METHOD

(75) Inventor: Reiji Segawa, Kadoma (JP)

(73) Assignee: Matsushita Electric Industrial Co., Ltd., Kadoma (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/802,643

(22) Filed: Feb. 19, 1997

(30) Foreign Application Priority Data

Feb. 21, 1996 (JP) .................................... 8-034116

(51) Int. Cl.[7] ...................................... G06F 17/50
(52) U.S. Cl. .................. 703/1; 703/13; 716/11; 716/13; 716/14
(58) Field of Search .................. 364/489, 490, 364/491; 703/1, 13; 716/14, 13, 11

(56) References Cited

U.S. PATENT DOCUMENTS

| 4,484,292 | * | 11/1984 | Hong et al. ............... 364/491 |
| 5,222,293 | * | 6/1993 | Ozimek et al. ............ 29/833 |
| 5,249,134 | * | 9/1993 | Oka .......................... 364/491 |
| 5,251,147 | * | 10/1993 | Finnerty .................... 364/490 |
| 5,267,176 | * | 11/1993 | Antreich et al. .......... 364/491 |
| 5,381,343 | * | 1/1995 | Bamji et al. ............... 364/488 |
| 5,471,398 | * | 11/1995 | Stephens .................. 364/490 |
| 5,481,473 | * | 1/1996 | Kim et al. ................. 364/489 |
| 5,613,102 | * | 3/1997 | Chiang et al. ............ 395/500 |
| 5,638,293 | * | 6/1997 | Scepanovic et al. ..... 364/491 |
| 5,666,288 | * | 9/1997 | Jones et al. ............... 364/489 |
| 5,712,794 | * | 1/1998 | Hong ........................ 364/491 |
| 5,901,066 | * | 5/1999 | Hong ........................ 364/491 |

FOREIGN PATENT DOCUMENTS

| 417345A1 | 3/1991 | (EP) . |
| 05282402 | 10/1993 | (JP) ................. G06F/15/60 |

OTHER PUBLICATIONS

Search Report for European Patent Application No. 97102675.2, mailed Jul. 17, 1997.
Abstract No. 4252668 for Chan, "Design Automation For Multichip Module–Issues and Status", International Journal of High Speed Electronics, vol. 2, No. 4, pp. 263–285, Singapore, Dec. 1991.
Abstract No. 4788132 for Sandborn et al, "Multichip Systems and Trade–Off Analysis Tool", Journal of Electronic Testing: Theory and Applications, vol. 5, No. 2–3, pp. 207–218, Netherlands, May–Aug. 1994.

* cited by examiner

Primary Examiner—Kevin J. Teska
Assistant Examiner—Thai Phan
(74) Attorney, Agent, or Firm—Renner, Otto, Boisselle, Sklar

(57) ABSTRACT

A layout input apparatus of the present application includes: an input section for inputting first coordinate information representing a position of a first circuit portion included in a first semiconductor integrated circuit and second coordinate information representing a position of a second circuit portion included in a second semiconductor integrated circuit. The layout input apparatus further includes a control section for performing a predetermined coordinate transformation with respect to the second coordinate information; and a storage section for storing the first coordinate information as at least a part of first layout data representing a layout of the first semiconductor integrated circuit and storing the transformed second coordinate information as at least a part of second layout data representing a layout of the second semiconductor integrated circuit.

18 Claims, 31 Drawing Sheets

*FIG.23*

| Property name | Layer name and coordinate of first LSI | Layer name and coordinate of second LSI |
|---|---|---|
| A | M13 (100,100) | M23 (100,100) |
| B | M13 (200,200) | M23 (200,200) |
| ⋮ | | |

⇓ Coordinate transformation

| | | |
|---|---|---|
| A | M13 (100,100) | M23 (−100,100) |
| B | M13 (200,200) | M23 (−200,200) |
| ⋮ | | |

FIG. 28
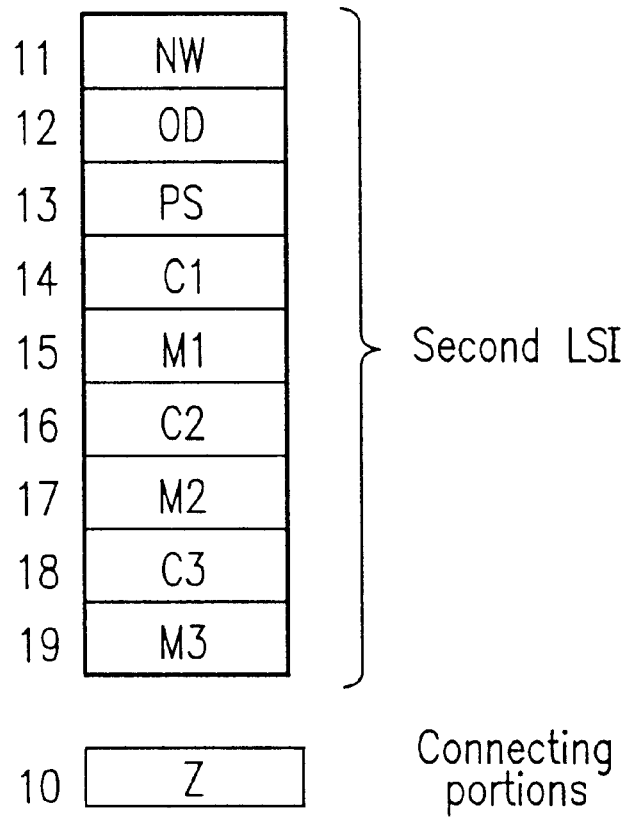
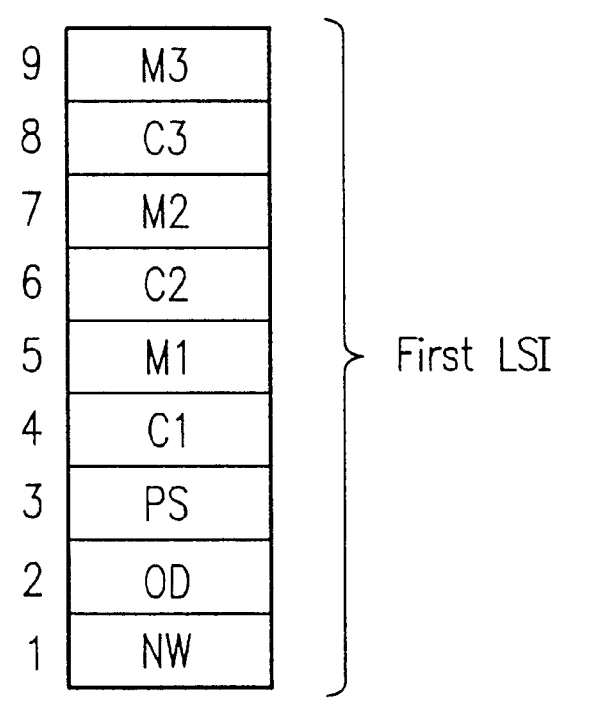

LAYOUT INPUT APPARATUS, LAYOUT INPUT METHOD, LAYOUT VERIFICATION APPARATUS, AND LAYOUT VERIFICATION METHOD

BACKGROUND OF THE INVENTION

1. Field of the Invention

The present invention relates to a layout input apparatus, a layout input method, a layout verification apparatus and a layout verification method.

2. Description of the Related Art

In recent years, the degree of integration of semiconductor integrated circuits is increasing, and their operation speed is becoming higher. Under this circumstance, various large-scale systems are being realized by a semiconductor integrated circuit formed on a single chip, which greatly contributes to the miniaturization and decrease in cost of such systems.

However, in order to produce a semiconductor integrated circuit whose minimum size is reduced to a quarter micron or less, significant capital investment is required. Furthermore, it is becoming difficult to enhance production yield with the increase in chip area and high integration of a semiconductor integrated circuit. Therefore, it may cost lower to realize a large-scale system by combining a plurality of relatively large semiconductor integrated circuits produced by a conventional process than to realize a large-scale system on a single chip.

A mounting technique as shown in FIGS. 34A through 34D has been proposed for the purpose of reducing the production cost and mounting area of a semiconductor integrated circuit. According to this mounting technique, a semiconductor chip with a first LSI formed thereon (first LSI chip) and a semiconductor chip with a second LSI formed thereon (second LSI chip), as shown in FIG. 34A, are mounted in a single package in such a manner that they are superposed on top of the other. For example, a semiconductor integrated circuit chip with a central processing unit (CPU) formed thereon is used as the first LSI chip, and a semiconductor integrated circuit chip with a static RAM (SRAM) is used as the second LSI chip.

Conventional semiconductor integrated circuits are composed of a number of semiconductor devices formed on one principal surface of a semiconductor substrate (semiconductor chip) and wirings connecting the devices to each other. According to the Flip & Stack mounting technique, two semiconductor chips are placed in such a manner that their surfaces on which semiconductor integrated circuits are formed face each other, as shown in FIGS. 34B through 34D. Terminal pins (not shown) of a package are electrically connected through bonding wires to a bonding pad provided on the periphery of the first LSI chip. Input/output (I/O) terminals of the second LSI chip are connected to I/O terminals for Flip & Stack mounting provided on the first LSI chip. Such a connection requires the first LSI chip and the second LSI chip to be provided with electrical connecting portions which have a "mirror inversion" relationship, as shown in FIG. 34A.

As described above, according to the conventional Flip & Stack mounting technique, two semiconductor integrated circuits which are different in function and use, such as a CPU and an SRAM, are used as the first and second LSIs. The layouts of these two semiconductor integrated circuits are independently designed by a conventional layout input method, after the coordinates of the connecting portions which have a mirror inversion relationship are defined.

However, the conventional layout input method does not allow the layouts of two LSIs to be designed simultaneously. This makes it difficult to determine optimum layouts, resulting in an increase in the time required for designing layouts. In addition, the layout verification is required to be conducted independently with respect to two LSIs. Therefore, the number of steps of forming net lists for an individual LSI increases. Furthermore, the connection between two LSIs is manually checked, which increases verification time and decreases reliability.

SUMMARY OF THE INVENTION

The layout input apparatus of the present invention, includes: an input section for inputting first coordinate information representing a position of a first circuit portion included in a first semiconductor integrated circuit and second coordinate information representing a position of a second circuit portion included in a second semiconductor integrated circuit; a control section for performing a predetermined coordinate transformation with respect to the second coordinate information; and a storage section for storing the first coordinate information as at least a part of first layout data representing a layout of the first semiconductor integrated circuit and storing the transformed second coordinate information as at least a part of second layout data representing a layout of the second semiconductor integrated circuit.

In one embodiment of the present invention, the control section performs the predetermined coordinate transformation when the second coordinate information is stored in the storage section.

In another embodiment of the present invention, the control section performs the predetermined coordinate transformation in response to the input of the second coordinate information.

In another embodiment of the present invention, the predetermined coordinate transformation includes a symmetrical transformation with respect to a predetermined axis.

In another embodiment of the present invention, the predetermined coordinate transformation further includes a parallel movement along a predetermined direction.

In another embodiment of the present invention, a first coordinate system for the first layout data is different from a second coordinate system for the second layout data.

In another embodiment of the present invention, each of the first coordinate system and the second coordinate system has an X-axis and a Y-axis, and an origin in the first coordinate system is shifted from an origin in the second coordinate system by a predetermined X-offset in a direction of the X-axis and by a predetermined Y-offset in a direction of the Y-axis.

In another embodiment of the present invention, the predetermined Y-offset is 0.

In another embodiment of the present invention, the predetermined X-offset is 0 and the predetermined Y-offset is 0.

According to another aspect of the present invention, a layout input method includes the steps of: inputting first coordinate information representing a position of a first circuit portion included in a first semiconductor integrated circuit and second coordinate information representing a position of a second circuit portion included in a second semiconductor integrated circuit; performing a predetermined coordinate transformation with respect to the second coordinate information; and storing the first coordinate information as at least a part of first layout data representing a layout of the first semiconductor integrated circuit and storing the transformed second coordinate information as at least a part of second layout data representing a layout of the second semiconductor integrated circuit.

According to another aspect of the present invention, a layout verification apparatus includes: a storage section for storing first layout data representing a layout of a first semiconductor integrated circuit, second layout data representing a layout of a second semiconductor integrated circuit, and connection information defining a position of a connecting portion connecting the first semiconductor integrated circuit to the second semiconductor integrated circuit; and a control section for specifying a first position in the first layout data corresponding to the position of the connecting portion and a second position in the second layout data corresponding to the position of the connecting portion, based on the connection information, and verifying the layouts of the first and second semiconductor integrated circuits, considering that the first position is connected to the second position.

In one embodiment of the present invention, the position of the connecting portion, the first position, and the second position are represented by an identical coordinate.

In another embodiment of the present invention, the first layout data includes a plurality of first layers, and the second layout data includes a plurality of second layers; and the first position is provided in a first layer of the plurality of the first layers in which the connecting portion is formed, and the second position is provided in a second layer of the plurality of second layers in which the connecting portion is formed.

In another embodiment of the present invention, the first layer in which the connecting portion is formed is a most significant layer of the plurality of first layers, and the second layer in which the connecting portion is formed is a most significant layer of the plurality of second layers.

In another embodiment of the present invention, the control section positions the first layout data and the second layout data in such a manner that the first layout data is not superposed on the second layout data on an identical coordinate system, and executes a verification processing, using the first layer included in the first layout data and the second layer included in the second layout data as one processing unit.

In another embodiment of the present invention, the control section compares the first and second layout data with a net list.

In another embodiment of the present invention, the control section verifies an open/short between an input and an output of a logical element represented by the first and second layout data.

According to another aspect of the present invention, a layout verification method verifying layouts of first and second semiconductor integrated circuits, based on first layout data representing the layout of a first semiconductor integrated circuit, second layout data representing the layout of a second semiconductor integrated circuit, and connection information defining a position of a connecting portion connecting the first semiconductor integrated circuit to the second semiconductor integrated circuit, includes the steps of: a) specifying a first position in the first layout data corresponding to the position of the connecting portion and a second position of the second layout data corresponding to the position of the connecting portion, based on the connection information; and b) verifying the layouts of the first and second semiconductor integrated circuits, considering that the first position is connected to the second position.

According to the present invention, because of the above-mentioned structure, the layouts of two LSIs can be designed while the layouts are being displayed so as to be superposed on top of the other on an identical screen. Therefore, information as to alterations in the layout of either LSI can be immediately reflected on the other, which makes it easy to optimize the layouts and shortens design time.

Furthermore, according to the above-mentioned method of the present invention, the layouts of two LSIs are simultaneously read and their connection is previously recognized. Therefore, the layouts can be logically verified only based on a net list of the combination of two LSIs. This can reduce the number of steps of forming net lists and prevent mistakes caused by a manual check of connecting portions.

Thus, the invention described herein makes possible the advantages of (1) providing a layout input apparatus and a layout input method capable of simultaneously laying out a plurality of LSIs; and (2) providing a layout verification apparatus and a layout verification method capable of simultaneously verifying the layouts of a plurality of LSIs.

These and other advantages of the present invention will become apparent to those skilled in the art upon reading and understanding the following detailed description with reference to the accompanying figures.

BRIEF DESCRIPTION OF THE DRAWINGS

FIG. 23 is a diagram showing an example of property information.

FIG. 28 is a diagram showing the corresponding relationship between the mask elements and the standard mask element No.

DESCRIPTION OF THE PREFERRED EMBODIMENTS

The layout input apparatus and the layout input method according to the present invention provides for simultaneously laying out a plurality of LSIs. Such a layout input apparatus and a layout input method are particularly suitable for designing the layout of a semiconductor chip used for Flip & Stack mounting.

Figure 1B:
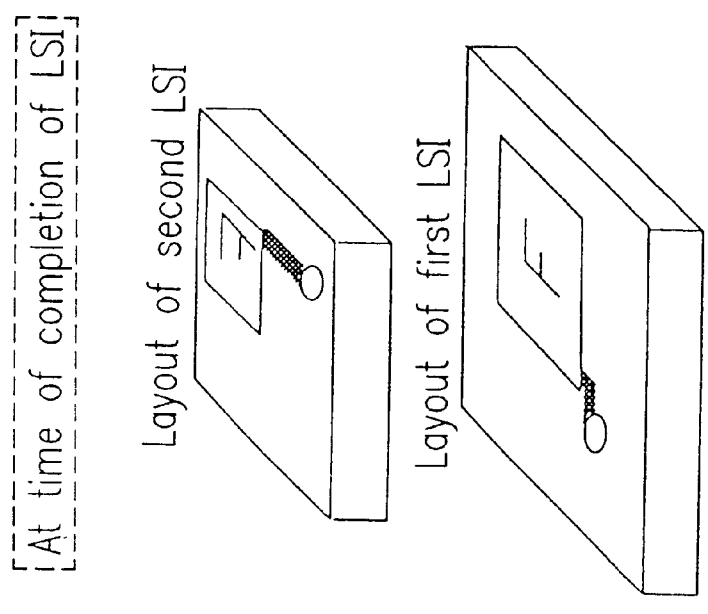
FIG. 1B shows layout images at a time of completion of LSIs.
Figure 1A:
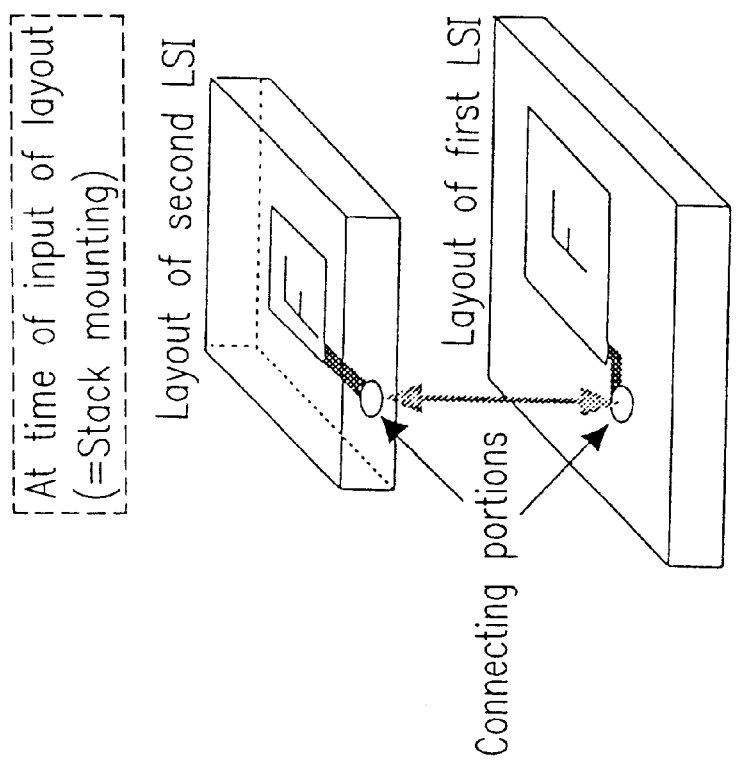
FIG. 1A shows layout images at a time of input of layouts.

FIG. 1A schematically shows two LSI chips mounted by Flip & Stack mounting. FIG. 1B schematically shows the layouts of two LSI chips before Flip & Stack mounting. As shown in FIG. 1A, in order to electrically connect the two LSI chips, the connecting portions of these chips are positioned so as to face each other during mounting, whereas the connecting portions in the layout graphics of semiconductor integrated circuits formed on the respective chips are shifted from each other, as shown in FIG. 1B.

The layout input apparatus of the present invention displays, through the second LSI chip, two semiconductor integrated circuit portions respectively formed on two LSI chips mounted by Flip & Stack mounting, which are superposed on top of the other, as shown in FIG. 1A. Because of this, the position of the connecting portions of the two LSI chips is clearly displayed in the two superposed layout graphics. This results in substantial reduction of time required for the layout design. In addition, the information of alterations in one layout can be reflected on the other layout, so that the layouts of the two superposed LSIs can be easily optimized and design time shortens.

A plurality of semiconductor integrated circuits used for Flip & Stack mounting can be obtained, for example, by dividing a single semiconductor integrated circuit including a plurality of logical blocks into a plurality of semiconductor integrated circuit portions in the course of designing layouts. For example, in the case where a single semiconductor integrated circuit includes a plurality of logical blocks, the division of the semiconductor integrated circuit can be realized by extracting parameters representing the characteristics of each of a plurality of logical blocks and classifying a plurality of logical blocks into a plurality of groups in accordance with the parameters. The logical blocks belonging to the identical group are assigned to the identical semiconductor integrated circuit portion.

Figure 2A:
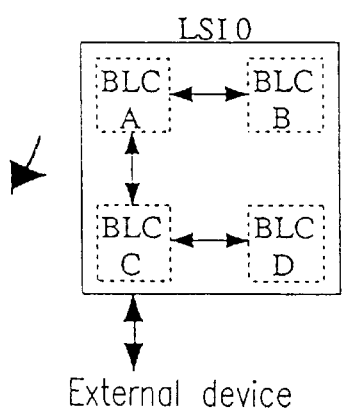
FIG. 2A shows a structure of a single semiconductor integrated circuit including a plurality of logical blocks.

FIG. 2A schematically shows one semiconductor integrated circuit LSI 0 including a plurality of logical blocks (BLC A, BLC B, BLC C and BLC D). Here, the operation speed of the logical blocks (BLC A and BLC B) is 25 MHz, and that of the logical blocks (BLC C and BLC D) is 50 MHz. A plurality of logical blocks (BLC A, BLC B, BLC C and BLC D), respectively, have differing characteristics as well as common characteristics. For example, the logical blocks (BLC B and BLC D) may be composed of digital circuits, and the other logical blocks (BLC A and BLC C) may be composed of analog circuits. In this case, the logical blocks can be classified into a first group (logical blocks BLC A and BLC C) and a second group (logical blocks BLC B and BLC D), based on the parameter representing whether the logical block is composed of a digital circuit or an analog circuit. Accordingly, the classification of the groups varies depending upon the parameter representing the characteristic of interest.

Figure 2B:
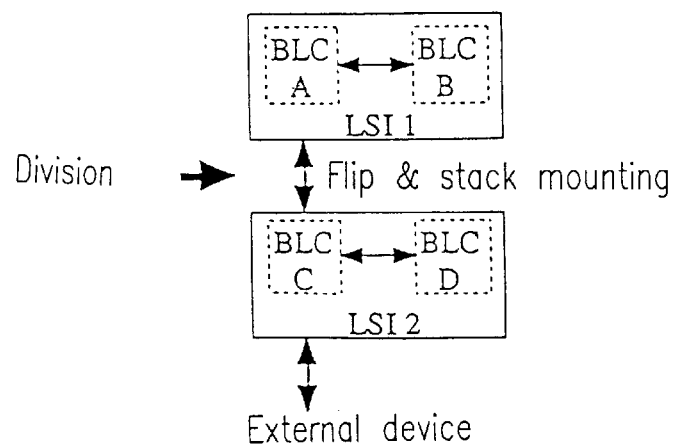
FIG. 2B shows a structure of two semiconductor integrated circuit portions in the case where a plurality of logical blocks are classified into two groups.

FIG. 2B schematically shows the case where 4 logical blocks (BLC A, BLC B, BLC C and BLC D) are classified into two groups based on the operation speed, and two groups are assigned to two semiconductor chips. More specifically, the logical blocks (BLC A and BLC B) are assigned to a first semiconductor integrated circuit portion LSI 1, and the logical blocks (BLC C and BLC D) are assigned to a second semiconductor integrated circuit portion LSI 2. These two semiconductor integrated circuit portions are formed respectively on different semiconductor chips by a known semiconductor production process. Thereafter, a plurality of semiconductor chips are mounted in one package by a multi-chip mounting technique and electrically connected to each other. Thus, a plurality of semiconductor chips are integrated as one semiconductor device.

As described above, a plurality of semiconductor integrated circuit chips suitable for multi-chip mounting can be produced efficiently by dividing a single semiconductor integrated circuit into a plurality of semiconductor integrated circuit portions in the course of designing layouts. Each of a plurality of semiconductor integrated circuit portions thus obtained has logical blocks classified based on the characteristic parameter as constituent elements. Therefore, a layout which excludes a useless space as a whole and is suitable for the improvement of operation speed can be obtained. For example, in the case where a semiconductor integrated circuit portion designed by a 0.5 µm rule is formed on one of a pair of semiconductor chips for the multi-chip mounting and a semiconductor integrated circuit portion designed by a 1.0 µm rule is formed on the other chip, a semiconductor chip with a semiconductor integrated circuit portion designed by a mild design rule can be produced at low cost with relatively high yield. Therefore, a package price for the semiconductor integrated circuit as a whole can be reduced. Furthermore, in the case where semiconductor integrated circuit portions which operate at different clock frequencies are formed on a plurality of semiconductor chips for the multi-chip mounting, each semiconductor integrated circuit portion operates at a required clock frequency without wasting electric power so that power consumption can be reduced as a whole.

Figure 3:
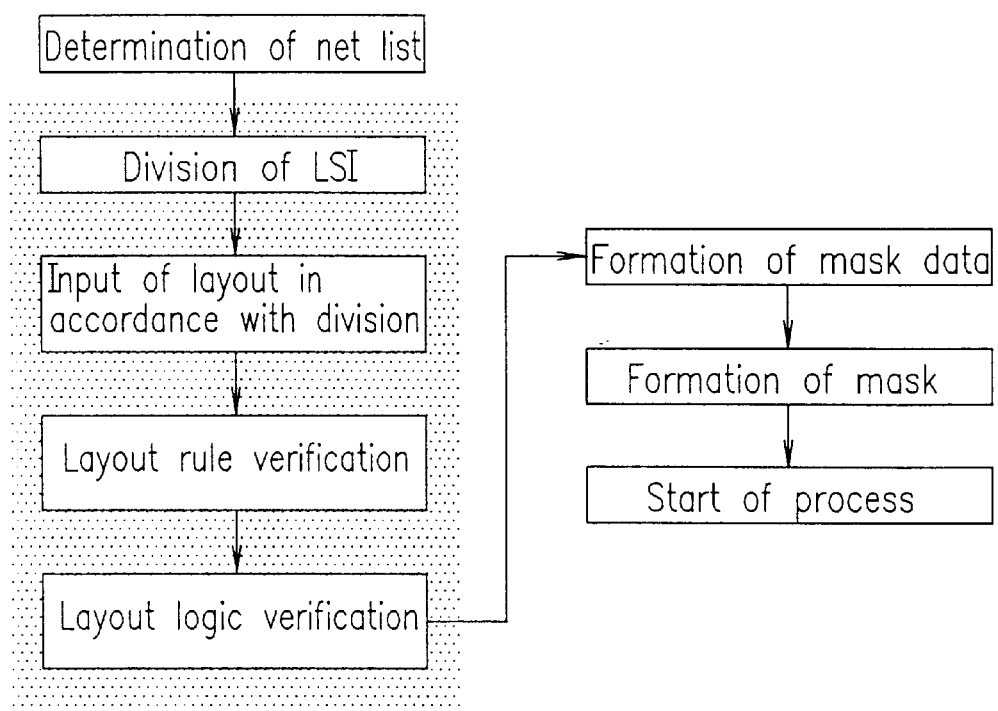
FIG. 3 is a flow chart of an entire process for designing a semiconductor integrated circuit including the step of dividing the circuit.

Next, referring to FIG. 3, a design flow of a semiconductor integrated circuit including a division step of the circuit will be schematically described.

First, as shown in FIG. 3, each group is defined based on the parameter of blocks included in the group. The hierarchy in accordance with each group is generated on a net list, whereby one semiconductor integrated circuit is divided into at least two semiconductor integrated circuit portions.

Then, the layouts of the divided semiconductor integrated circuit portions are input, and the layout rule verification is conducted with respect to each semiconductor integrated circuit portion. Thereafter, the layout logic verification is conducted between the laid out semiconductor integrated circuit and the net list.

After the layout design is thus completed, mask data is formed by a known method. A plurality of masks (photomasks) are produced based on the mask data. The semiconductor production process is conducted using a plurality of masks thus produced, whereby the divided semiconductor integrated circuit portions can be respectively produced on separate semiconductor chips.

As described above, one semiconductor integrated circuit is not divided into a plurality of functional blocks to be arranged on one semiconductor chip. Instead of this, one semiconductor integrated circuit is divided into a plurality of semiconductor integrated circuit portions to be assigned to at least two semiconductor chips.

Figure 4:
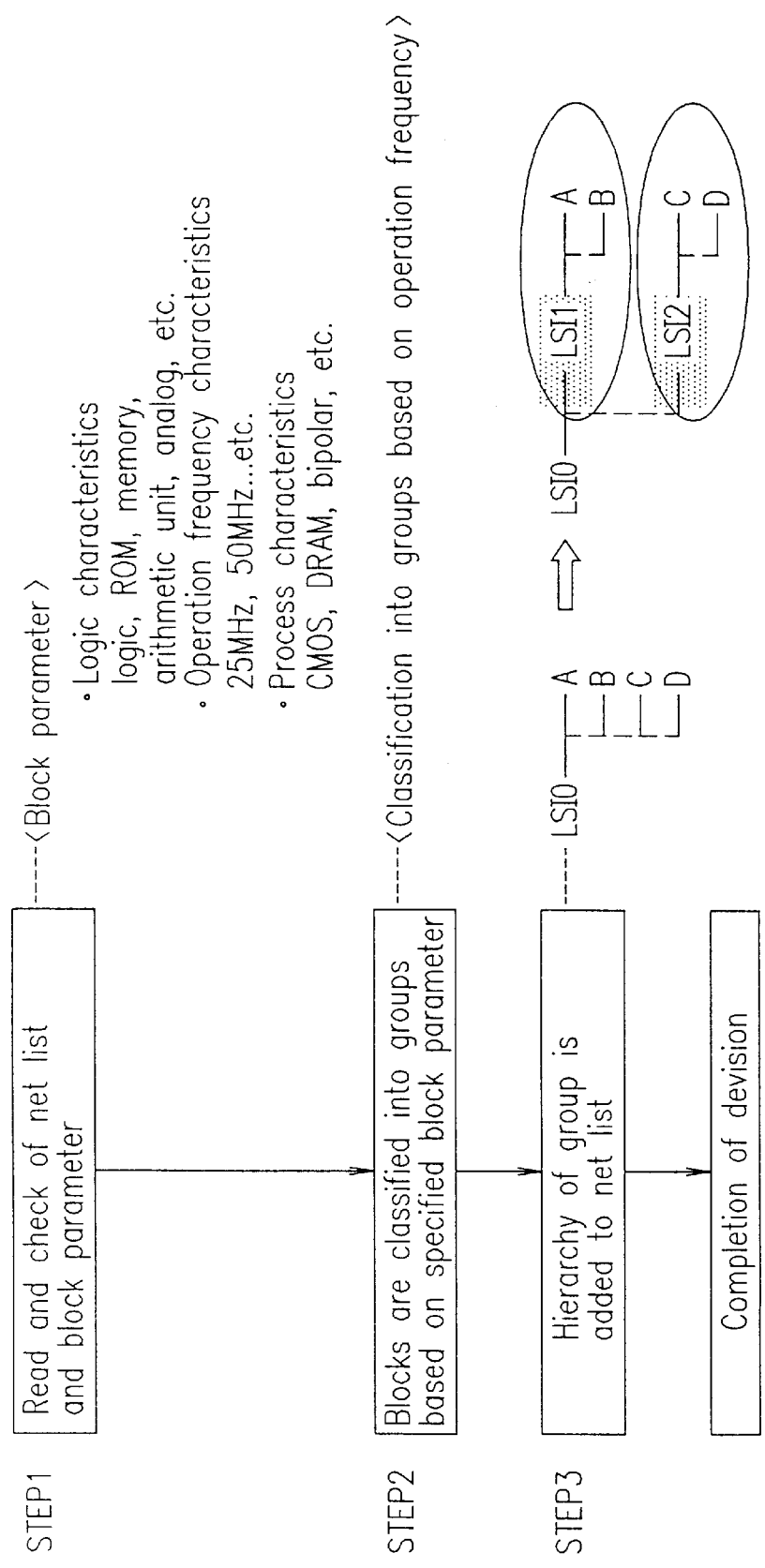
FIG. 4 is a flow chart showing an example of a method for dividing a semiconductor integrated circuit.

Next, referring to FIG. 4, an exemplary method for dividing a semiconductor integrated circuit will be described in more detail.

In STEP 1, the net list and the parameters of the respective blocks included in a semiconductor integrated circuit are read, and the parameters of the respective blocks are checked. At this time, the hierarchy of the net list has a structure in which blocks A, B, C and D are arranged in parallel with each other under the semiconductor integrated circuit LSI 0 (see the lower central portion of FIG. 4).

The parameters of the respective blocks are classified into those representing logic characteristics, operation frequency characteristics, process characteristics, etc. The logic characteristics include the type of a logic element, a ROM, a RAM, an arithmetic unit, an analog element, etc. The operation frequency characteristics include the level of frequencies such as 25 MHz and 50 MHz. The process characteristics include the type of process for a CMOS, a DRAM, a bipolar element, a bi-CMOS, etc. Other characteristics include whether or not it is a memory core or a peripheral circuit, a design rule, a threshold of a transistor, etc.

In STEP 2, logical blocks are classified into groups based on the characteristics specified from the above-mentioned parameters. In this example, it is assumed that the logical blocks are classified into groups based on the operation frequency characteristics. The operation frequency of the logical blocks (BLC A and BLC B) is 25 MHz, and the operation frequency of the logical blocks (BLC C and BLC D) is 50 MHz. In this case, the logical blocks are classified into Group 1 (LSI 1: operation frequency 25 MHz)=logical blocks BLC A and BLC B and Group 2 (LSI 2: operation frequency 0 MHz)=logical blocks BLC C and BLC D. The hierarchy in accordance with these groups is added to the net list. In the case of this example, the hierarchy of the net list has a structure in which semiconductor integrated circuit portions LSI 1 and LSI 2 are arranged under the semiconductor integrated circuit LSI 0, as shown in the lower right portion of FIG. 4.

As described above, one semiconductor integrated circuit LSI 0 can be divided into two semiconductor integrated circuit portions LSI 1 and LSI 2. Thereafter, a layout of each semiconductor integrated circuit portion is input for designing the layout. Such a layout input requires the connecting portions which connect two semiconductor integrated circuit portions to each other to be appropriately positioned. Thus, in the case of the present invention, a layout which is different from that in the case of arranging a plurality of functional blocks classified into groups on the identical semiconductor chip is required to be designed with respect to the respective semiconductor integrated circuit portions thus divided.

Hereinafter, the semiconductor integrated circuit portions LSI 1 and LSI 2 will be referred to as a "first LSI" and a "second LSI", respectively. It should be noted that the "first LSI" and the "second LSI" are not limited to those obtained by dividing a single semiconductor integrated circuit into a plurality of semiconductor integrated circuit portions. The layout input apparatus and the layout input method according to the present invention can be applied to any of a plurality of semiconductor integrated circuit portions having layout data related to each other.

Hereinafter, the present invention will be described by way of illustrative embodiments.

Embodiment 1

Referring to FIGS. 5 through 14, a layout input apparatus and a layout input method of Embodiment 1 according to the present invention will be described.

Figure 5:
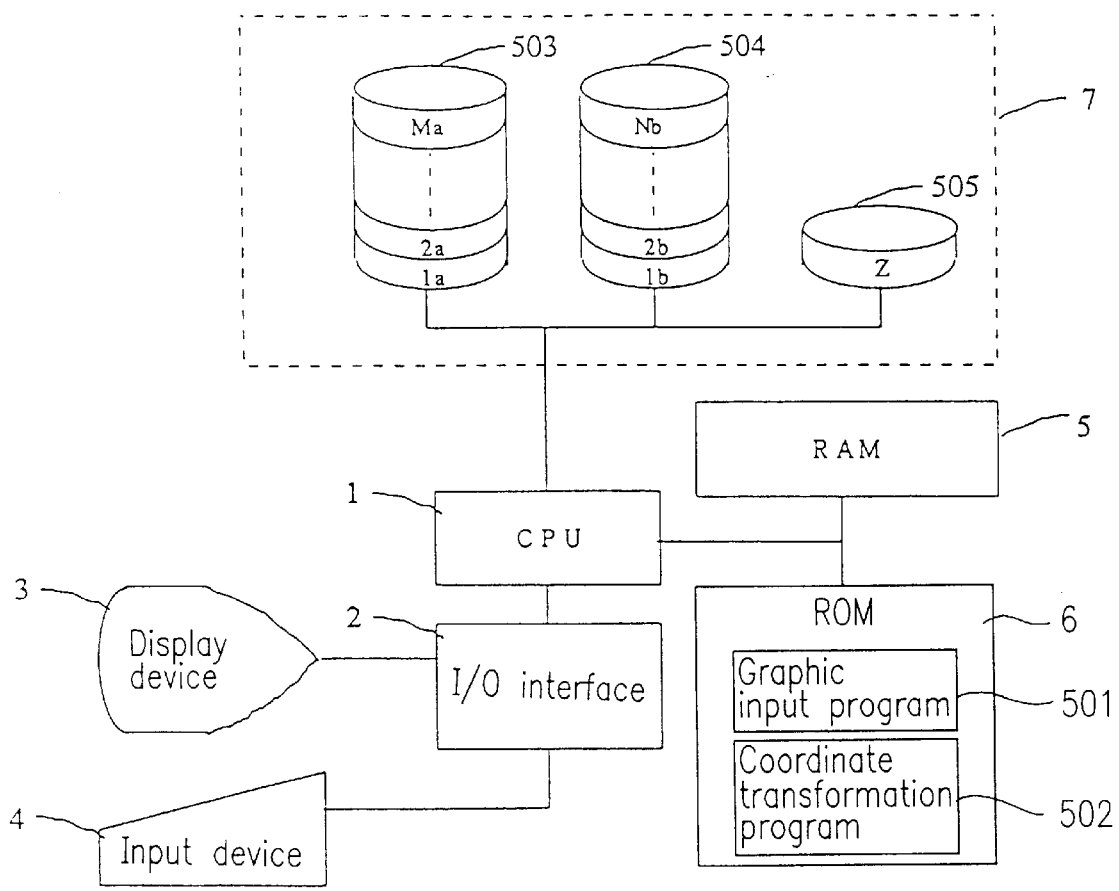
FIG. 5 is a block diagram showing a structure of a layout input apparatus of Embodiment 1 according to the present invention.

As shown in FIG. 5, a layout input apparatus includes an input device 4 through which a layout designer or the like inputs a layout and a display device 3 which is capable of displaying a two-dimensional input layer or the like of layout data for the layout designer. The input device 4 includes a keyboard, a mouse, and the like, and the display device 3 includes a CRT, a flat panel display, and the like. The display device 3 and the input device 4 are connected to a CPU 1 through an I/O interface 2. The CPU 1 is connected to a RAM 5 and a ROM 6 storing a graphic input program 501, a coordinate transformation program 502, etc.

A data storing section 7 stores layout data 503 of the first LSI, layout data 504 of the second LSI, and layout data (connection information) 505 representing connecting portions between the first LSI and the second LSI. Each of the layout data 503 of the first LSI and the layout data 504 of the second LSI is composed of a plurality of two-dimensional input layers. The two-dimensional input layers include data corresponding to the pattern of each mask used in a process for producing a semiconductor integrated circuit.

The layout data will be described with reference to FIG. 6. The layout data of the semiconductor integrated circuit is composed of a plurality of mask elements (a mask used for the production process, i.e., during a lithography step is based on the mask elements). The shape and arrangement of transistors, wirings, wiring contacts, etc. included in the semiconductor integrated circuit are defined by superposing one mask element on another.

Next, a procedure for forming the layout data 503 through 505 will be described with reference to FIG. 7.

First, in STEP 1, the CPU 1 reserves a space area required for storing the layout data 503 through 505 in the data storing section 7 so as to form a database. The reservation of such a space area is executed in response to the "layout start" command input by, for example, a layout designer through the input device 4.

Next, in STEP 2, the layout designer inputs layouts of the first LSI and the second LSI. The coordinate system used in the case of inputting the layout of the first LSI is identical with that used in the case of inputting the layout of the second LSI. The coordinate input through the input device 4 is displayed on the display device 3 without being transformed. This enables the layouts of the first and second LSIs to be designed while the layouts of the first and second LSIs are being displayed so as to be superposed on each other on the identical screen.

In STEP 2, the layout of the connecting portions connecting the first LSI to the second LSI is input. The remaining STEP 3 through STEP 7 are discussed in greater detail below.

Figure 8A:
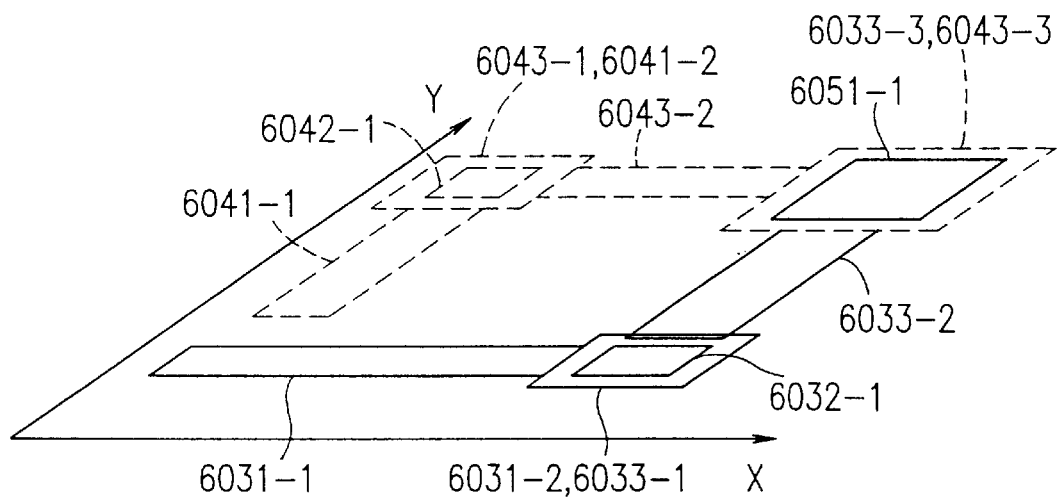
FIG. 8A is a perspective view of a screen of a display device 3.
Figure 8B:
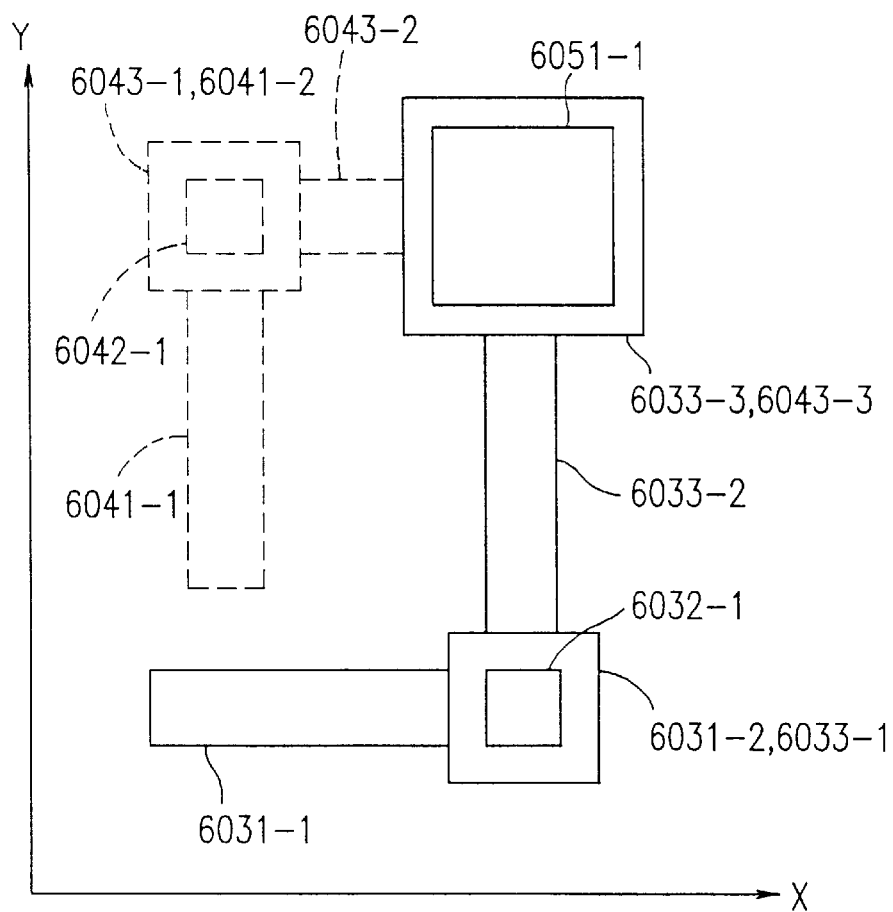
FIG. 8B is a top plan view of the screen the display device 3.

FIGS. 8A and 8B are exemplary screens of the display device 3 in which each coordinate showing the positions of circuit portions 6031-1, 6031-2, 6032-1, 6033-1 through 6033-3 included in the first LSI, each coordinate showing the positions of circuit portions 6041-1, 6041-2, 6042-1, 6043-1 through 6043-3 included in the second LSI, and the coordinate showing the position of a connecting portion 6051-1 are input. In the case where a circuit portion is a square, for example, the coordinate on the upper left end of the square and the lower right end of the square are input.

In FIGS. 8A and 8B, solid lines represent the circuit portions related to the first LSI, broken lines represent the circuit portions related to the second LSI, and boldface lines represent the connecting portion. Usually, coordinate axes (X-axis and Y-axis) are not displayed on the screen of the display device 3; however, in FIGS. 8A and 8B, an X-axis and a Y-axis are displayed in order to emphasize the use of an input coordinate system common to the first and second LSIs. The information of the coordinate input through the input device 4 is stored in the RAM 5 without being transformed. Such an input of the information of the coordinate can be achieved, for example, by using the graphic input program 501 stored in the ROM 6.

Figure 9:
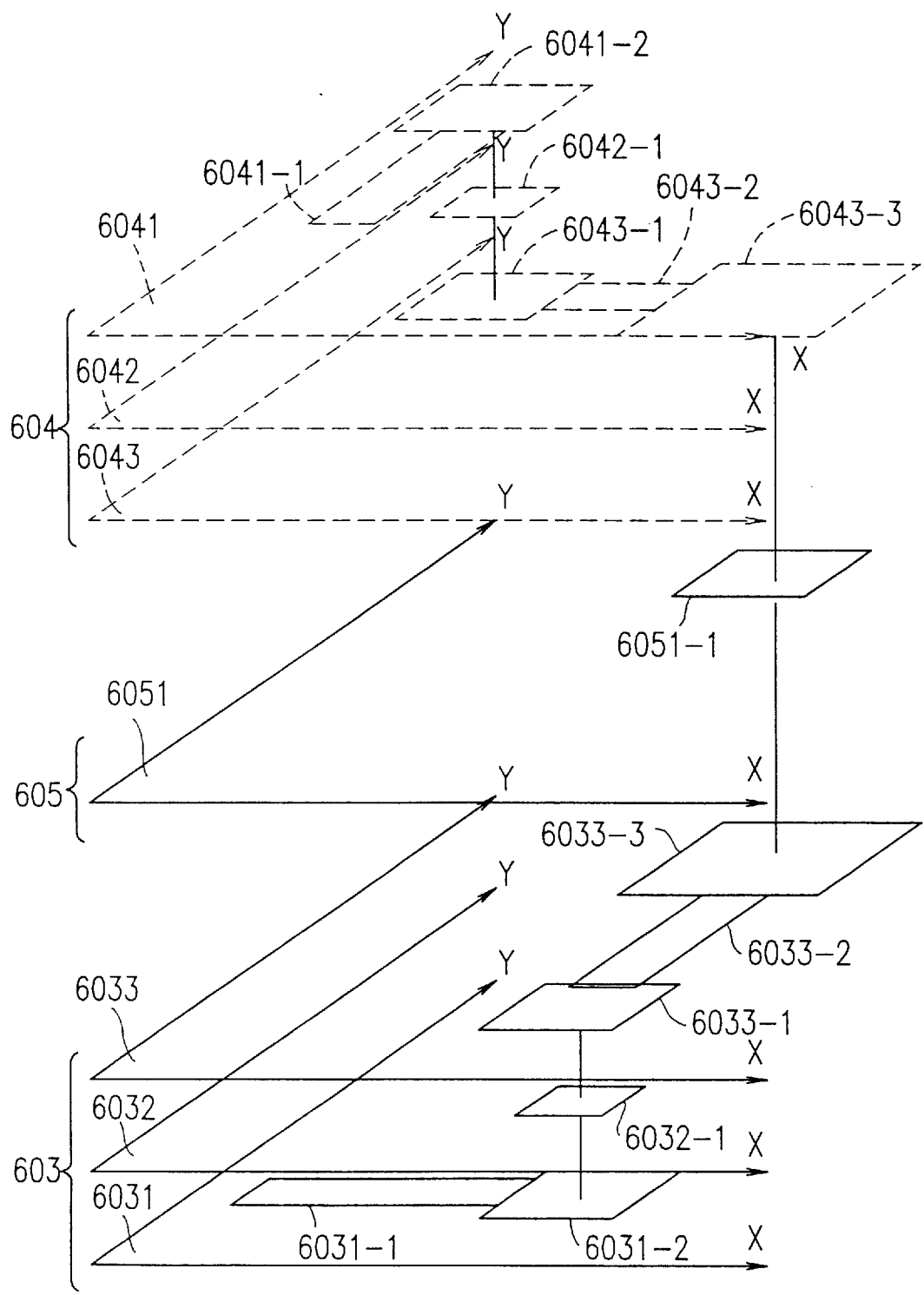
FIG. 9 shows a structure of coordinate information 603 through 605 stored in a ROM 5.

FIG. 9 shows an example of coordinate information 603 through 605 stored in the RAM 5 as a result of the input of the layouts of the first and second LSIs. In this example, the coordinate information 603 of the first LSI and the coordinate information 604 of the second LSI, respectively, have a three-layered structure, and are correlated with each other through a connecting layer 6051 of the coordinate information 605.

The coordinate information 603 includes coordinate information of the circuit portions 6031-1 and 6031-2 laid out on a layer 6031, coordinate information of the circuit portions 6032-1 laid out on a layer 6032, and coordinate information of the circuit portions 6033-1 through 6033-3 laid out on a layer 6033.

The coordinate information 604 includes coordinate information of the circuit portions 6041-1 and 60412 laid out on a layer 6041, coordinate information of the circuit portions 6042-1 laid out on a layer 6042, and coordinate information of the circuit portions 6043-1 through 6043-3 laid out on a layer 6043.

In order to lay out a specified circuit portion on a specified layer included in the first and second LSIs, the information identifying the first LSI and the second LSI and the information representing the specified layer should be input in addition to the coordinate information specifying the position of the specified circuit portion. Such an input can be usually executed by selecting a menu displayed on the display device 3.

In Embodiment 1, the coordinate system of the coordinate information 603 and the coordinate system of the coordinate information 604 stored in the RAM 5 are identical. These coordinate systems are also identical with the above-mentioned input coordinate system. This means that the coordinate information input through the input device 4 is stored in the RAM 5 without being transformed.

Figure 10:
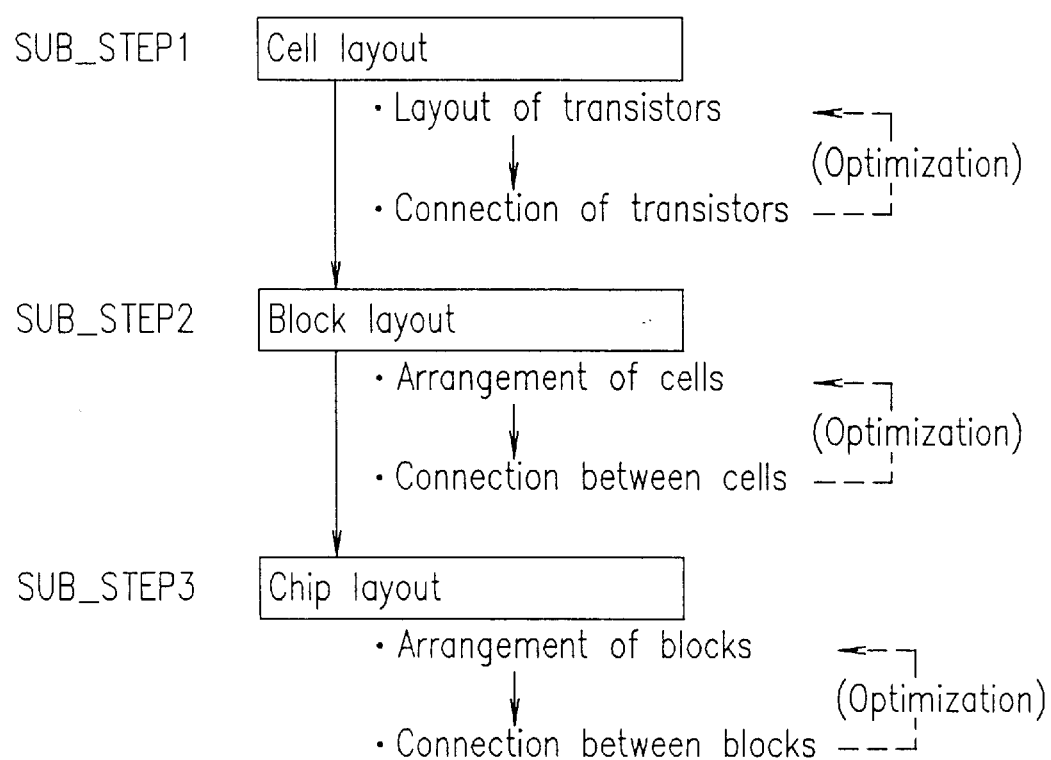
FIG. 10 is a flow chart showing detailed steps of inputting a layout.

Next, STEP 2 will be described in detail with reference to FIG. 10.

First, in SUB_STEP1, the layout designer lays out a component called a cell realizing a simple logic such as an inverter, NAND, and NOR.

In SUB_STEP2, the layout designer conducts arrangement and wiring of the cell in accordance with a logic of a block level net list.

In SUB_STEP3, the layout designer conducts arrangement and wiring of a block layout in accordance with a top level net list.

Figure 11:
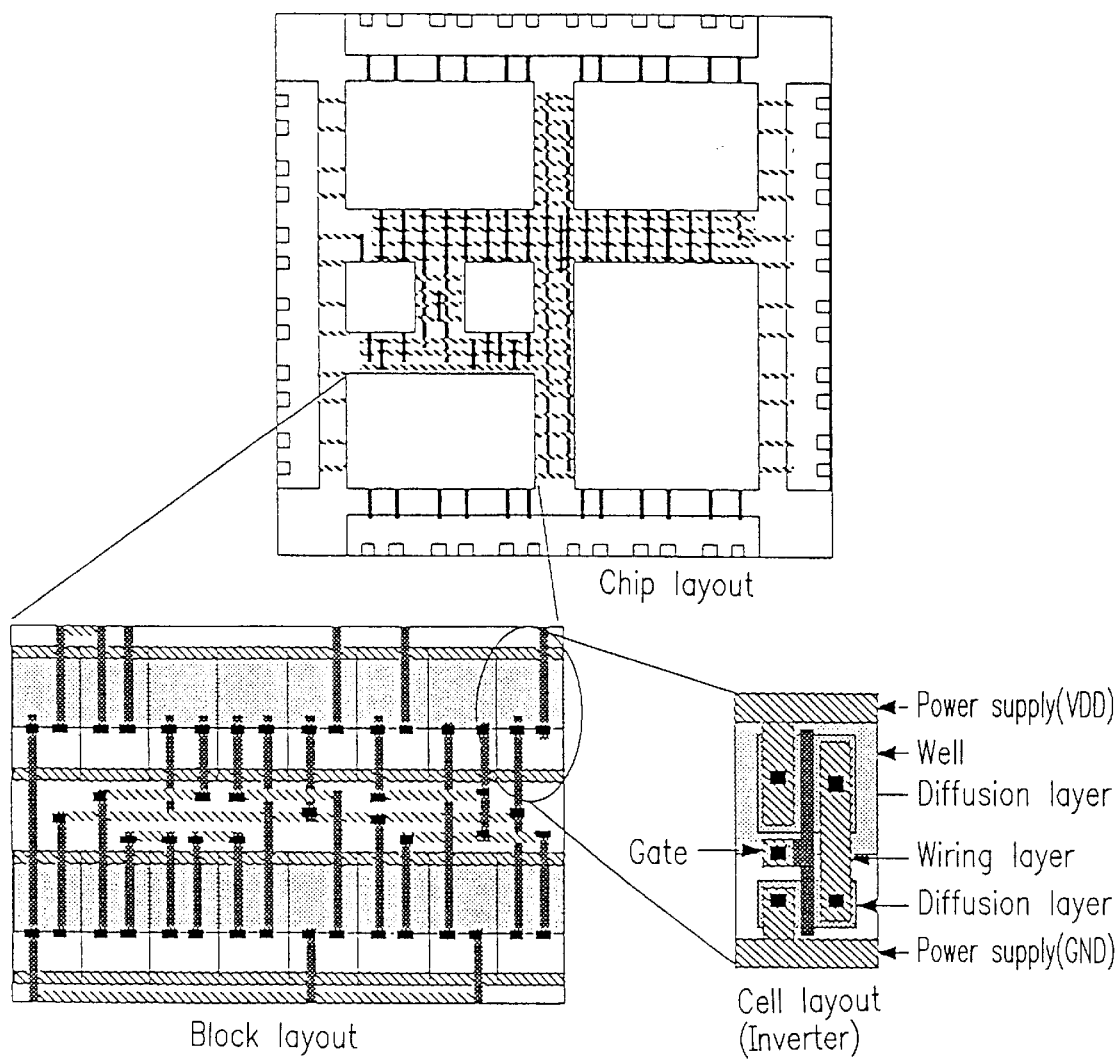
FIG. 11 shows layouts at each level.

In each of the above steps, the layout designer optimizes the layout while performing temporary arrangement, wiring estimation, etc. In the present embodiment, the layout designer performs rough arrangement of the connecting portions of the first and second LSIs, and then, proceeds to SUB_STEP3. If there is any inconvenience in SUB_STEP3, SUB_STEP2 is performed again. The relationship between the layouts formed in each step in FIG. 10 is shown in FIG. 11.

Returning now to FIG. 7, after finishing STEP 2, the layout designer proceeds to STEP 3. In STEP 3, the layout designer confirms the inconvenience or the like caused by the connection, and returns to STEP 2, if correction is required, so as to optimize the layout. If there is no problem, the layout designer proceeds to STEP 4.

In STEP 4, the CPU 1 judges whether or not the coordinate transformation is conducted with respect to the coordinate information stored in the RAM 5. Such a judgement is executed in response to the "layout end/layout data save" command input through the input device 4, for example, by the layout designer.

In the case where the coordinate transformation is judged to be required in STEP 4, the layout designer proceeds to STEP 5. Otherwise, the layout designer proceeds to STEP 7.

In STEP 5, Y-axis symmetrical transformation is performed with respect to the coordinate information. Thereafter, in STEP 6, the origin movement transformation is further performed with respect to the result obtained by performing the Y-axis symmetrical transformation of the coordinate information.

In STEP 7, the CPU 1 outputs the layout data 503 through 505 formed in accordance with the above procedure to the data storing section 7.

For example, in the case of forming the layout data 503 through 505 of the first and second LSIs used for Flip & Stack mounting, the CPU 1 stores the coordinate information 603 of the first LSI in the data storing section 7 as at least a part of the layout data 503 without performing the coordinate transformation with respect to the coordinate information 603, performs the coordinate transformation with respect to the coordinate information 604 of the second LSI, and stores the result obtained by performing the coordinate transformation with respect to the coordinate information 604 in the data storing section 7 as at least a part of the layout data 504. In this manner, the coordinate transformation with respect to the coordinate information 604 is executed after the coordinate information 604 is read from the RAM 5 and before the coordinate information 604 is stored in the data storing section 7.

In the case of multi-chip mounting other than Flip & Stack mounting, the above-mentioned coordinate transformation is not required.

Figure 12:
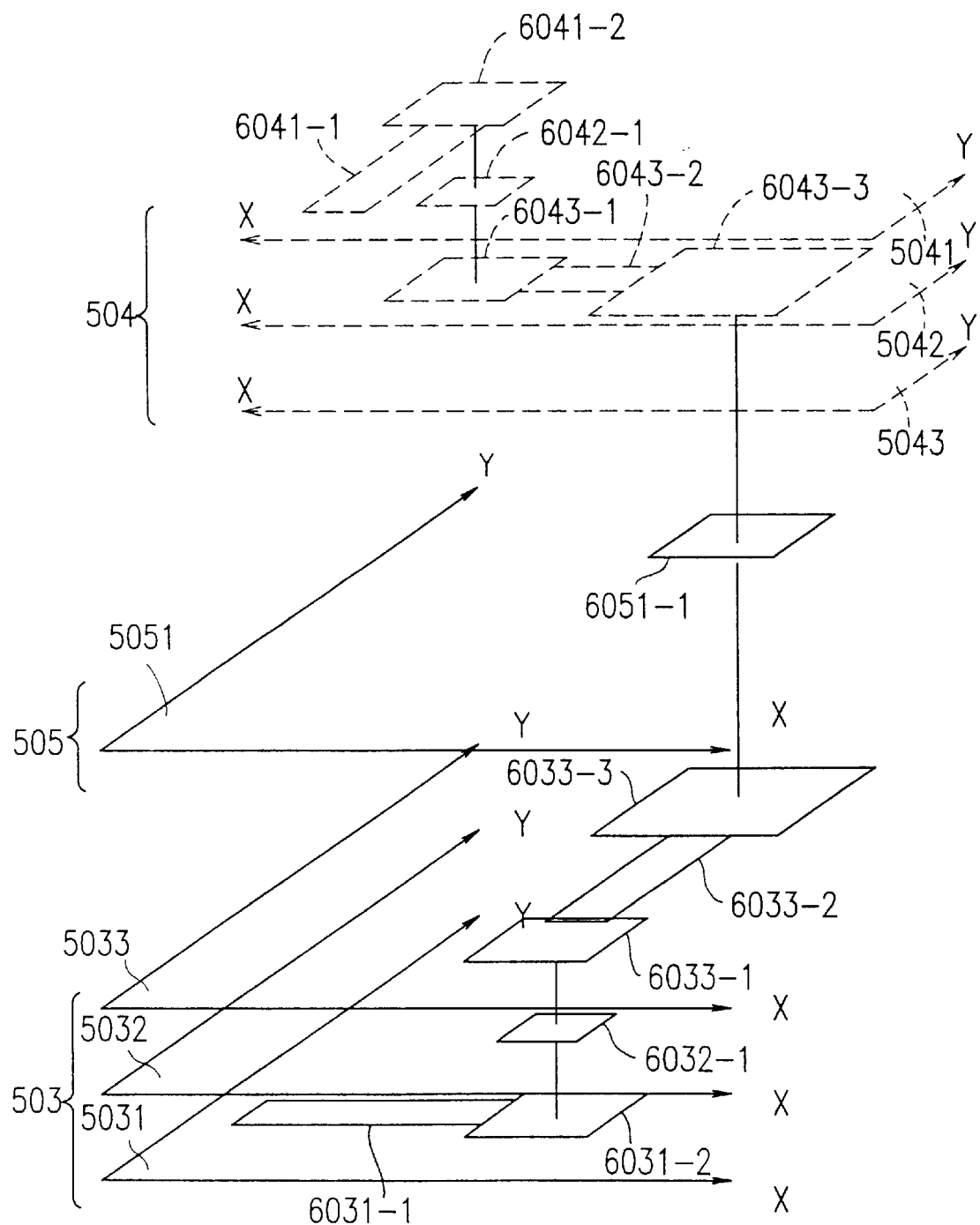
FIG. 12 shows a structure of the layout data 503 through 505 stored in a data storing section 7.

FIG. 12 shows an example of the layout data 503 through 505 stored in the data storing section 7. The layout data 503 and 505 shown in FIG. 12 are identical with the coordinate information 603 and 605 shown in FIG. 9. The layout data 504 in FIG. 12 is equal to the result obtained by performing the Y-axis symmetrical transformation and the origin movement transformation with respect to the coordinate information 604 in FIG. 9.

Next, the Y-axis symmetrical transformation and the origin movement transformation will be described in detail.

Figure 6:
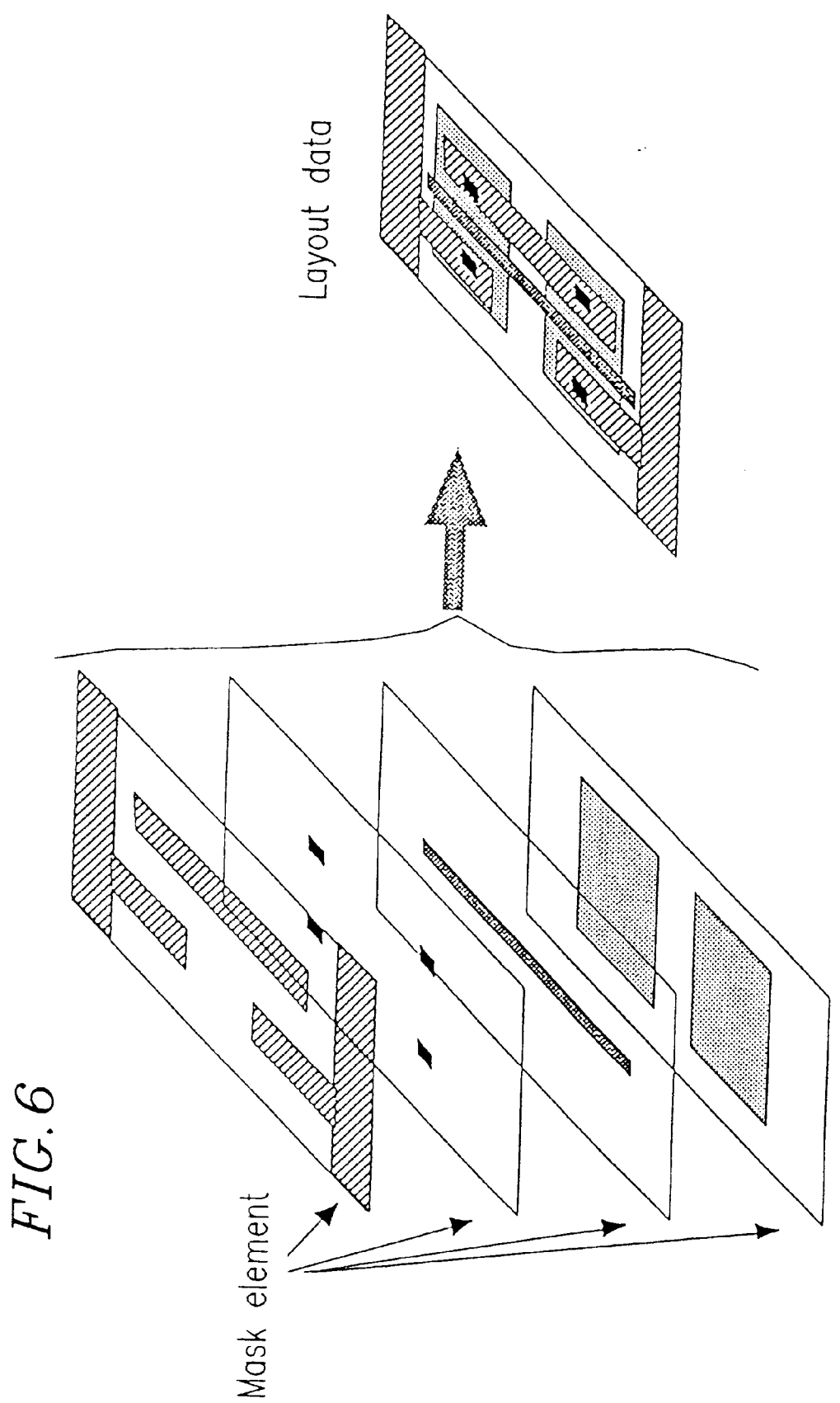
FIG. 6 is a perspective view showing the relationship between the layout data and the mask elements.

The pattern of the mask elements defining transistors, wirings, wiring contacts, and the like is usually represented by the combination of squares provided on a coordinate plane as shown in FIG. 6. The square on the coordinate plane is represented by coordinates of two vertices of a diagonal line of the square. In the case where these vertices are, for example, (10, 10) and (20, 20), the coordinate after the Y-axis symmetrical transformation is given by (−10, 10) and (−20, 20).

In the case where an X component of an external shape of the second LSI is 1000, the origin movement transformation is performed by adding (1000, 0) to the coordinate of two vertices of the square.

As a result of these coordinate transformations, two vertices of the square are represented by (990, 10) and (980, 20). The layout data 504 is obtained by performing the above-mentioned coordinate transformations with respect to each circuit potion of each layer included in the coordinate information 604.

Figure 13:
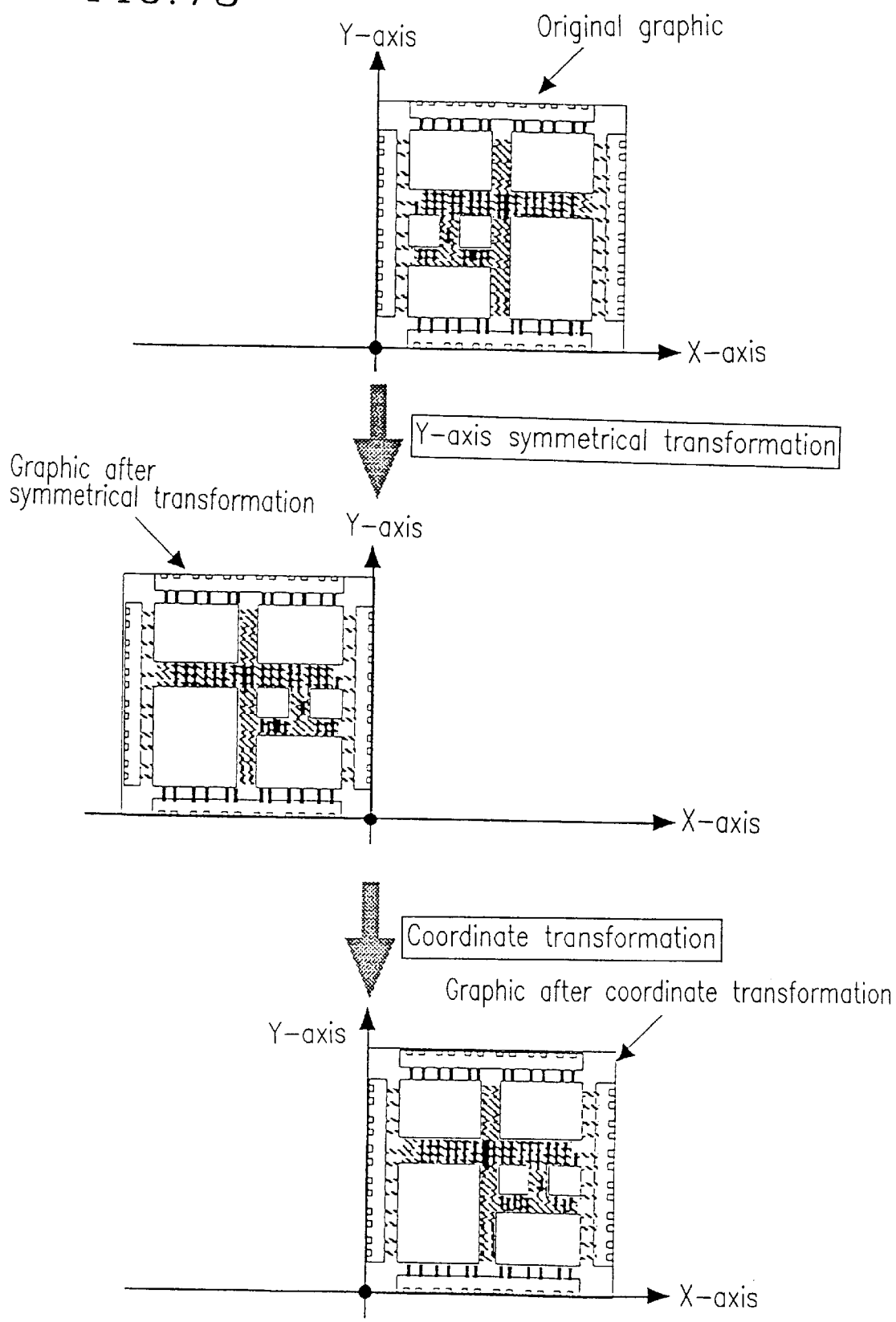
FIG. 13 shows the changes in layout graphic by coordinate transformations.

FIG. 13 schematically shows how the layout graphic (original graphic) of the second LSI is changed by the coordinate transformations. The original graphic shown in FIG. 13 corresponds to the layout graphic obtained by seeing the semiconductor integrated circuit portion formed under the second LSI chip through the second LSI chip in the state shown in FIG. 1A. In contrast, the graphic after the coordinate transformations corresponds to the layout graphic obtained by directly seeing the semiconductor integrated circuit portion formed on the second LSI chip in the arrangement shown in FIG. 1B from above. Mask data is produced by using the graphic after the coordinate transformations.

Figure 14:
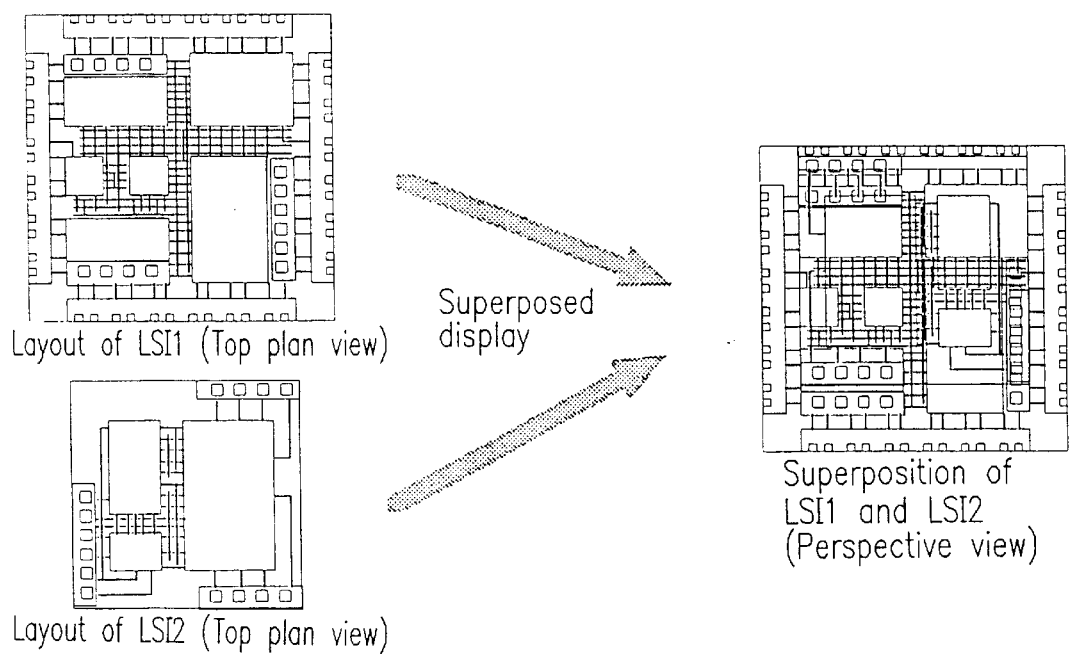
FIG. 14 shows a display screen (superposed display screen) of the layout input apparatus of Embodiment 1 according to the present invention.

FIG. 14 shows each layout of the first and second LSIs and a layout obtained by superposing these layouts on top of the other (perspective view). More specifically, the left side of FIG. 14 shows top views of semiconductor integrated circuit portions formed on the principal planes of two semiconductor chips; the right side of FIG. 14 shows a top view of a state in which the second semiconductor chip (LSI 2) is superposed on the first semiconductor chip (LSI 1) in such a manner that the respective principal planes face each other. This corresponds to Flip & Stack mounting, and the layout of the second semiconductor chip seen through a substrate is shown so as to be superposed on the layout of the first semiconductor chip.

In the apparatus shown in FIG. 5, after a graphic input layer is specified, the coordinate information representing the shape and position of the graphic to be input is input through the input device 4. Most of the graphics to be input are squares. In the case where the graphic to be input is a square, the coordinate information thereof can be the coordinate of two vertices of a diagonal line of the square. The input coordinate information is stored in the RAM 5 in accordance with the graphic input program 501. The CPU 1 displays the coordinate information stored in the RAM 5 on the display device 3 without transforming it. Thus, the layouts of the first and second LSIs are displayed as shown on the right side of FIG. 14. After the coordinate information is input, the CPU 1 selectively transforms the coordinate information stored in the RAM 5 by using the coordinate transformation program 502. The result of the transformation is stored in the data storing section 7 as layout data.

According to the present embodiment, a layout can be input while the layout graphic as shown on the right side of FIG. 14 is being displayed by the display device 3. As a result, the layouts of two LSIs for Flip & Stack mounting can be simultaneously designed, so that the mutual influence on the layouts due to the changes in arrangement of the connecting portions of two LSIs can be grasped at a glance and steps can be taken immediately. This enables the design period to be shortened and layouts to be optimized (i.e., highly integrated).

Embodiment 2

Referring to FIGS. 15 through 19, a layout input apparatus and a layout input method of Embodiment 2 according to the present invention will be described.

Figure 15:
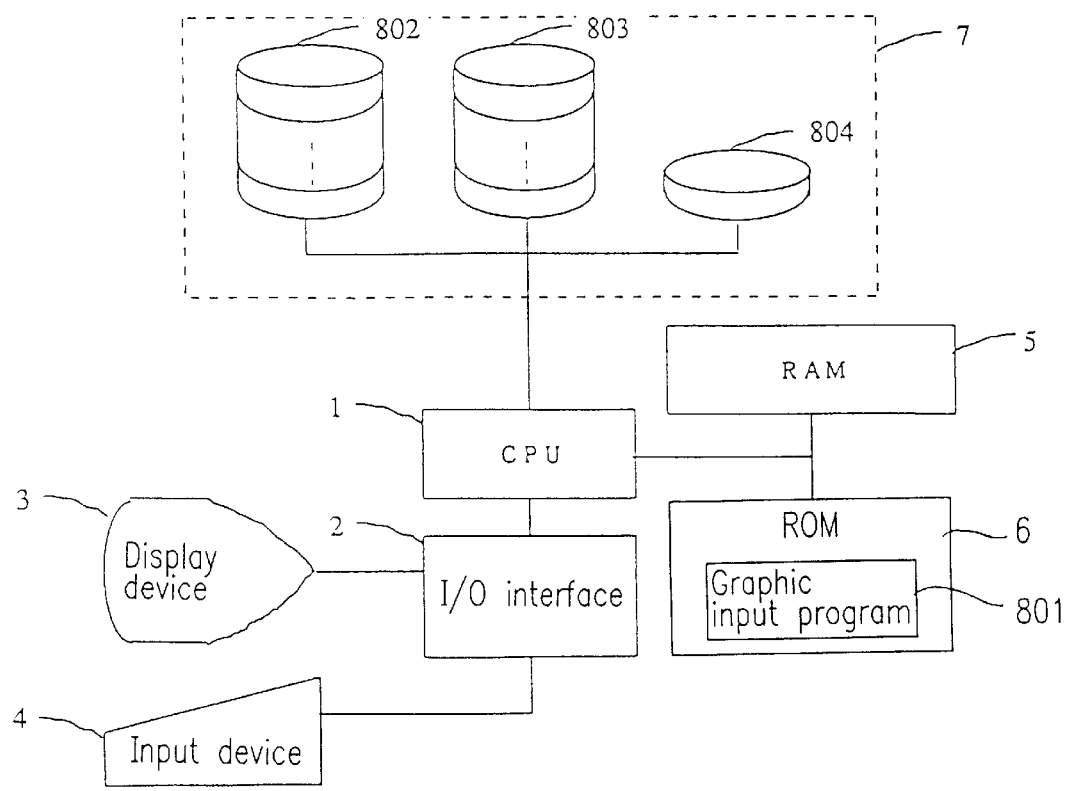
FIG. 15 is a block diagram showing a structure of a layout input apparatus of Embodiment 2 according to the present invention.

As shown in FIG. 15, a layout input apparatus includes an input device 4 through which a layout designer or the like inputs a layout and a display device 3 which is capable of displaying a two-dimensional input layer or the like of layout data for the layout designer. The input device 4 includes a keyboard, a mouse, and the like, and the display device 3 includes a CRT, a flat panel display, and the like. The display device 3 and the input device 4 are connected to a CPU 1 through an I/O interface 2. The CPU 1 is connected to a RAM 5 and a ROM 6 storing a graphic input program 801, etc.

A data storing section 7 stores layout data 802 of the first LSI, layout data 803 of the second LSI, and layout data 804 representing connecting portions between the first LSI and the second LSI. Each of the layout data 802 of the first LSI and the layout data 803 of the second LSI is composed of a plurality of two-dimensional input layers. The two-dimensional input layers include data corresponding to the pattern of each mask used in a process for producing a semiconductor integrated circuit.

Next, a procedure for forming the layout data 802 through 804 will be described with reference to FIG. 16.

First, in STEP 1, the CPU 1 reserves a space area required for storing the layout data 802 through 804 in the data storing section 7 so as to form a database. The reservation of such a space area is executed in response to the "layout start" command input by, for example, a layout designer through the input device 4.

Next, in STEP 2, the layout designer inputs layouts of the first LSI and the second LSI. In the same way as in Embodiment 1, the coordinate system used in the case of inputting the layout of the first LSI is identical with that used in the case of inputting the layout of the second LSI. The coordinate input through the input device 4 is displayed on the display device 3 without being transformed. This enables the layouts of the first and second LSIs to be designed while the layouts of the first and second LSIs are being displayed so as to be superposed on each other on the identical screen.

In STEP 2, the layout of the connecting portions connecting the first LSI to the second LSI is input.

The coordinate information input through the input device 4 is stored in the RAM 5 in accordance with the graphic input program 801 stored in the ROM 6. In the case where the coordinate information input through the input device 4 is that of the second LSI, the graphic input program 801 performs the coordinate transformation with respect to the coordinate information of the second LSI in response to the input of the coordinate information of the second LSI, and stores the result obtained by performing the coordinate transformation with respect to the coordinate information of the second LSI in the RAM 5. In the case where the coordinate information input through the input device 4 is that of the first LSI, the graphic input program 801 stores the coordinate information of the first LSI in the RAM 5 without performing the coordinate transformation with respect to it.

The coordinate information of the first and second LSIs thus stored in the RAM 5 has the same structure as that of the layout data 503 through 505 shown in FIG. 12. Therefore, unlike Embodiment 1, it is not required to perform the coordinate transformation with respect to the coordinate information of the second LSI at a time when the coordinate information of the second LSI stored in the RAM 5 is output to the data storing section 7.

The CPU 1 performs the coordinate transformation with respect to the coordinate information of the second LSI stored in the RAM 5, and then, displays the layout graphic on the display device 3 based on the transformed coordinate information. Because of this, the layout of the second LSI is displayed on the display device 3 in such a manner than it is seen through the reverse surface of a chip as shown on the right side of FIG. 14.

Figure 7:
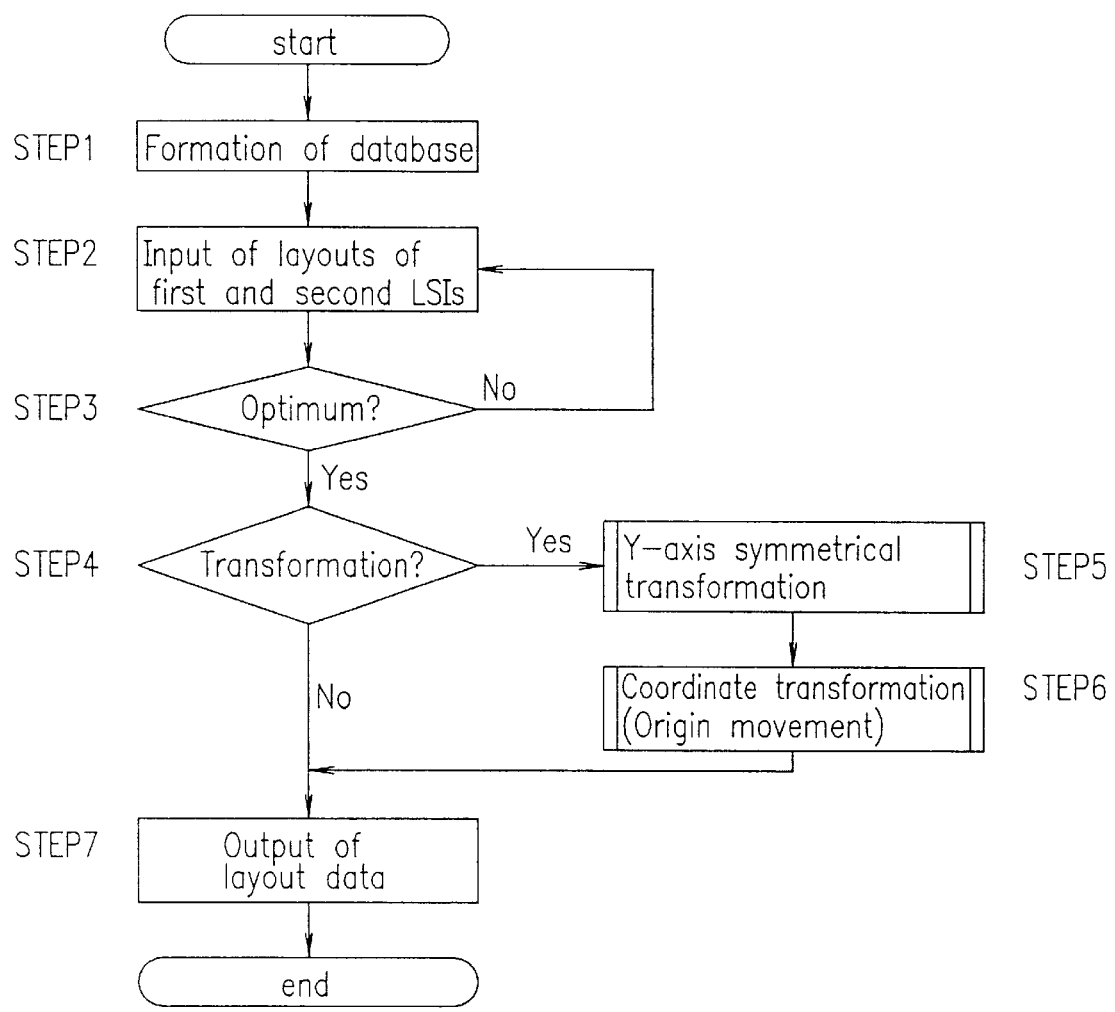
FIG. 7 is a flow chart showing a procedure for forming layout data 503 through 505.
Figure 16:
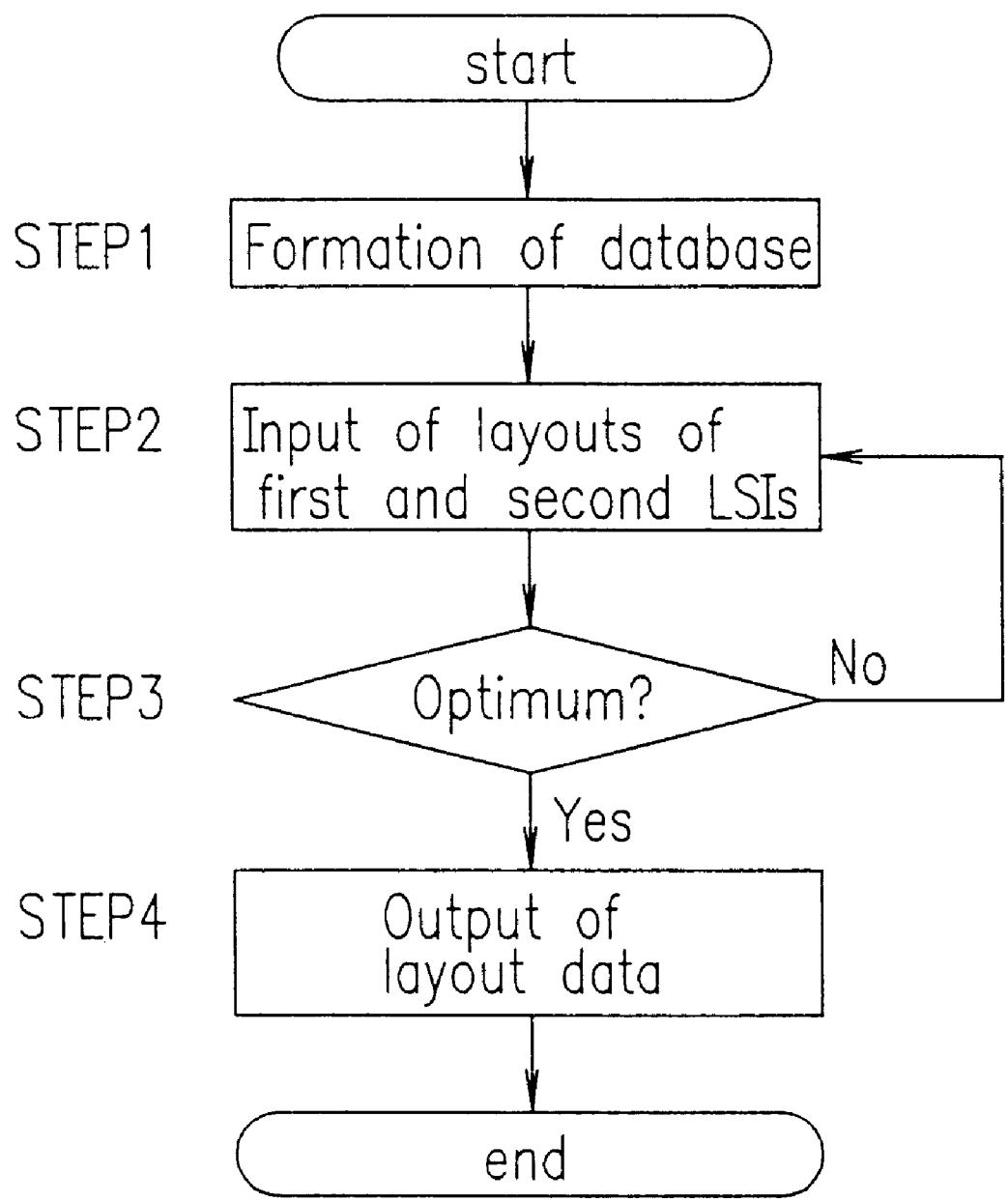
FIG. 16 is a flow chart showing a procedure for forming layout data 802 through 804.

The processings in STEP 3 and STEP 4 shown in FIG. 16 are identical with those of STEP 3 and STEP 7 shown in FIG. 7. Therefore, the description thereof will be omitted here.

Figure 17:
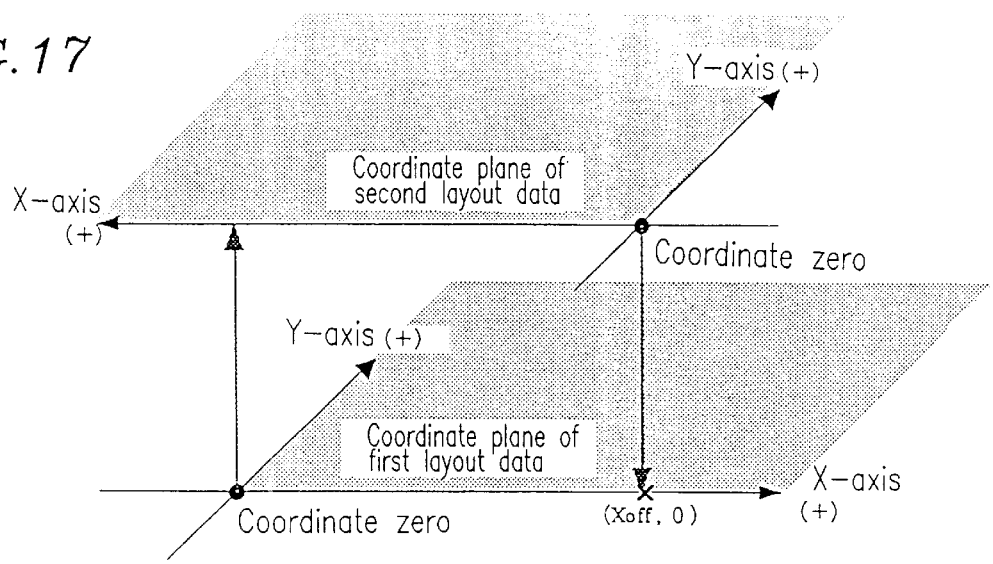
FIG. 17 shows an example of the relationship between the coordinate plane of the second layout data and the coordinate plane of the first layout data.

In Embodiment 2, the layout data 802 through 804 stored in the data storing section 7 have the same structures as those of the layout data 503 through 505 shown in FIG. 12. More specifically, as shown in FIG. 17, the sign (plus or minus) of an X-axis on the coordinate plane of the layout data 803 for the second LSI is opposite to that of an X-axis on the coordinate plane of the layout data 802 for the first LSI. Furthermore, the origin on the coordinate plane of the layout data 803 for the second LSI is shifted from the origin on the coordinate plane of the layout data 802 for the first LSI by a predetermined offset ($X_{off}$) along the X-axis direction of the layout data 802 for the first LSI. Therefore, the connecting portions between the first LSI and the second LSI should be input in the course of the layout design, in such a manner that the connecting portions in the layout graphics displayed on the display device 3 are superposed on each other.

Figure 18:
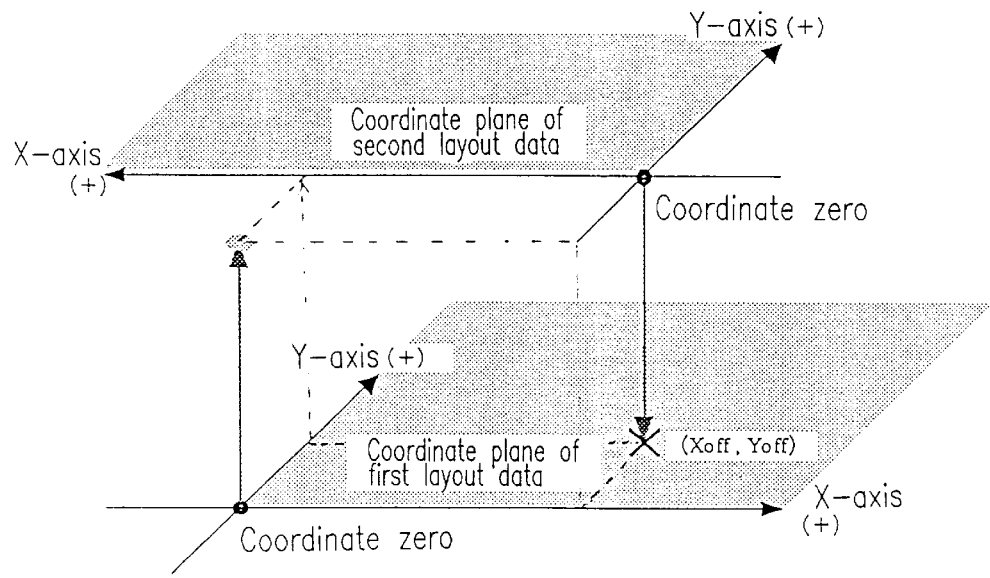
FIG. 18 shows another example of the relationship between the coordinate plane of the second layout data and the coordinate plane of the first layout data.
Figure 19:
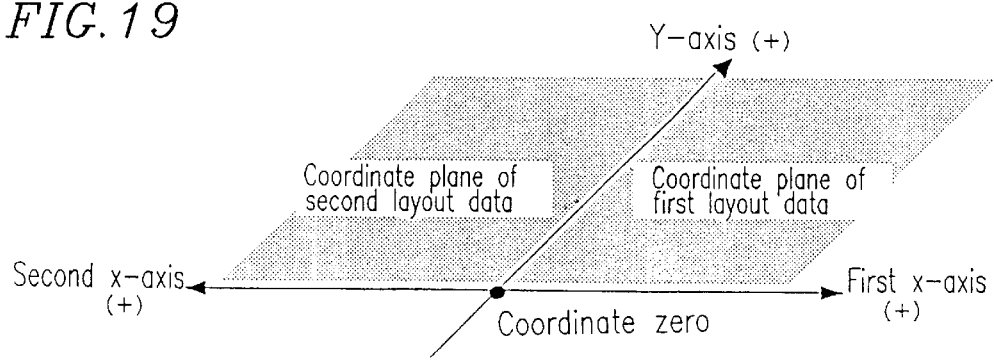
FIG. 19 shows still another example of the relationship between the coordinate plane of the second layout data and the coordinate plane of the first layout data.

As shown in FIG. 18, the origin on the coordinate plane of the layout data 803 for the second LSI may be shifted from the origin on the coordinate plane of the layout data 802 for the first LSI by a predetermined offset ($X_{off}$) along the X-axis direction and by a predetermined offset ($Y_{off}$) along the Y-axis direction of the layout data 802 for the first LSI. Furthermore, as shown in FIG. 19, the origin on the coordinate plane of the layout data 803 for the second LSI may be matched with the origin of the layout data 802 for the first LSI.

Embodiment 3

Hereinafter, referring to FIGS. 20 through 33, a layout verification apparatus and a layout verification method of Embodiment 3 according to the present invention will be described.

Figure 20:
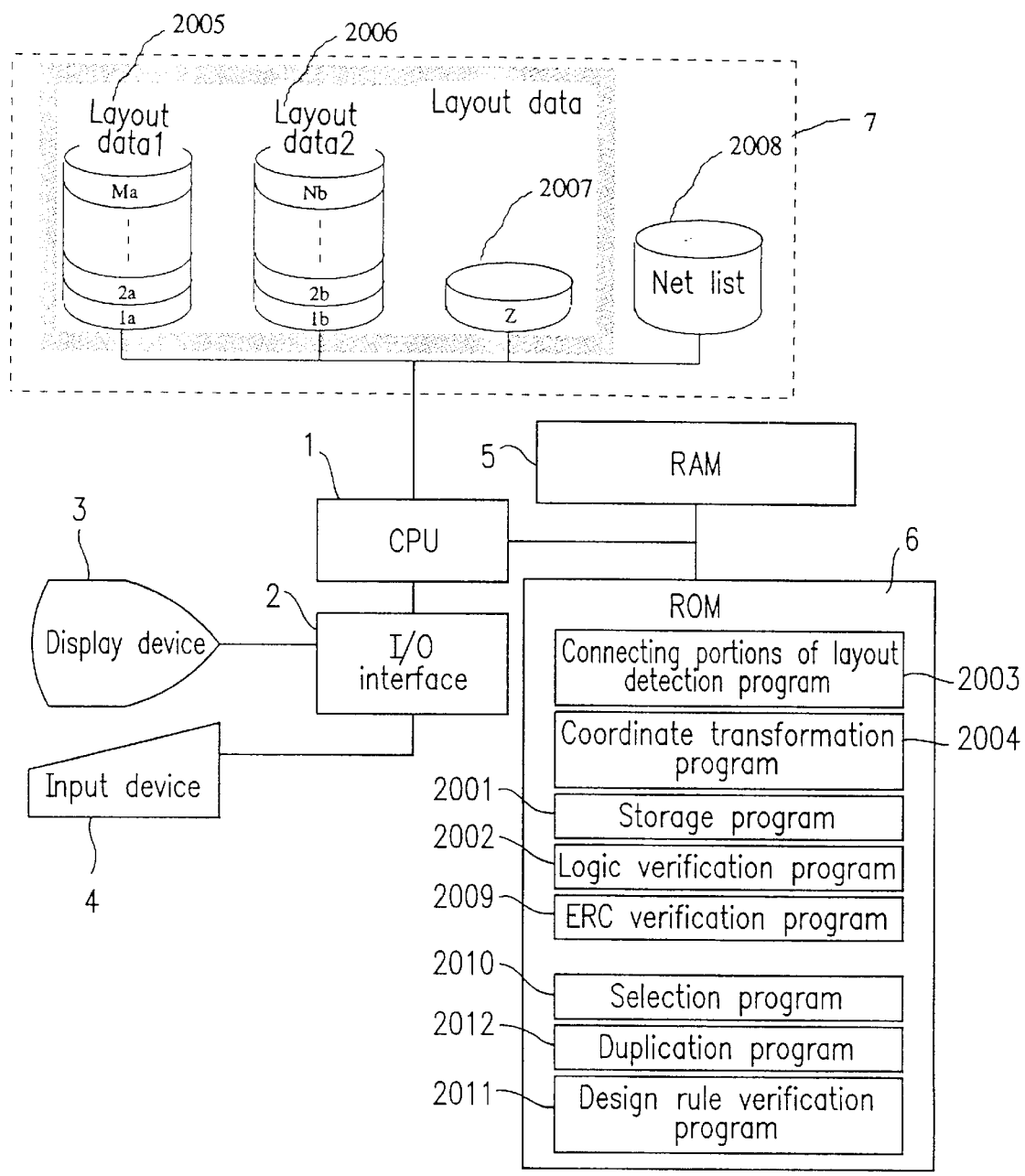
FIG. 20 is a block diagram showing a structure of a layout verification apparatus of Embodiment 3 according to the present invention.

As shown in FIG. 20, a layout verification apparatus includes an input device 4 and a display device 3 which is capable of displaying two-dimensional input layers or the like of the layout data for a layout designer. The input device 4 includes a keyboard, a mouse, and the like, and the display device 3 includes a CRT, a flat panel display, and the like. The display device 3 and the input device 4 are connected to a CPU 1 through an I/O interface 2. The CPU 1 is connected to a RAM 5 and a ROM 6. The ROM 6 stores connecting portions of layout detection program 2003, a coordinate transformation program 2004, a mask element storage program 2001, a logic verification program 2002, and an ERC verification program 2009. The ROM 6 further stores a selection program 2010, a duplication program 2012, and a design rule verification program 2011.

The data storing section 7 stores layout data 2005 of the first LSI, layout data 2006 of the second LSI, layout data (connection information) 2007 which represents connecting portions connecting the first LSI to the second LSI, and a net list 2008. The net list 2008 is an entire list of the first and second LSIs. Each of the layout data 2005 of the first LSI and the layout data 2006 of the second LSI is composed of a plurality of two-dimensional input layers. The two-dimensional input layers have data corresponding to the pattern of each mask used in a process for producing a semiconductor integrated circuit.

The layout verification of the semiconductor integrated circuit is classified into a DRC (Design Rule Check), an ERC (Electric Rule Check) and an LVS (Layout vs. Schematic).

The DRC is used for verifying a design rule related to the shape and arrangement of layout graphics. In the DRC, for example, a line width, a line interval, etc. are verified.

The ERC is used for verifying an electrical rule of a circuit realized on a layout. In the ERC, for example, an open/short of a gate/node, etc. is verified.

The LVS is used for verifying the consistency between a circuit represented by the net list and a circuit realized on a layout.

The layout verification apparatus of the present invention is applicable to any of the DRC, ERC and LVS.

First, the case where the layout verification apparatus of the present invention is applied to the LVS will be described.

Figure 21:
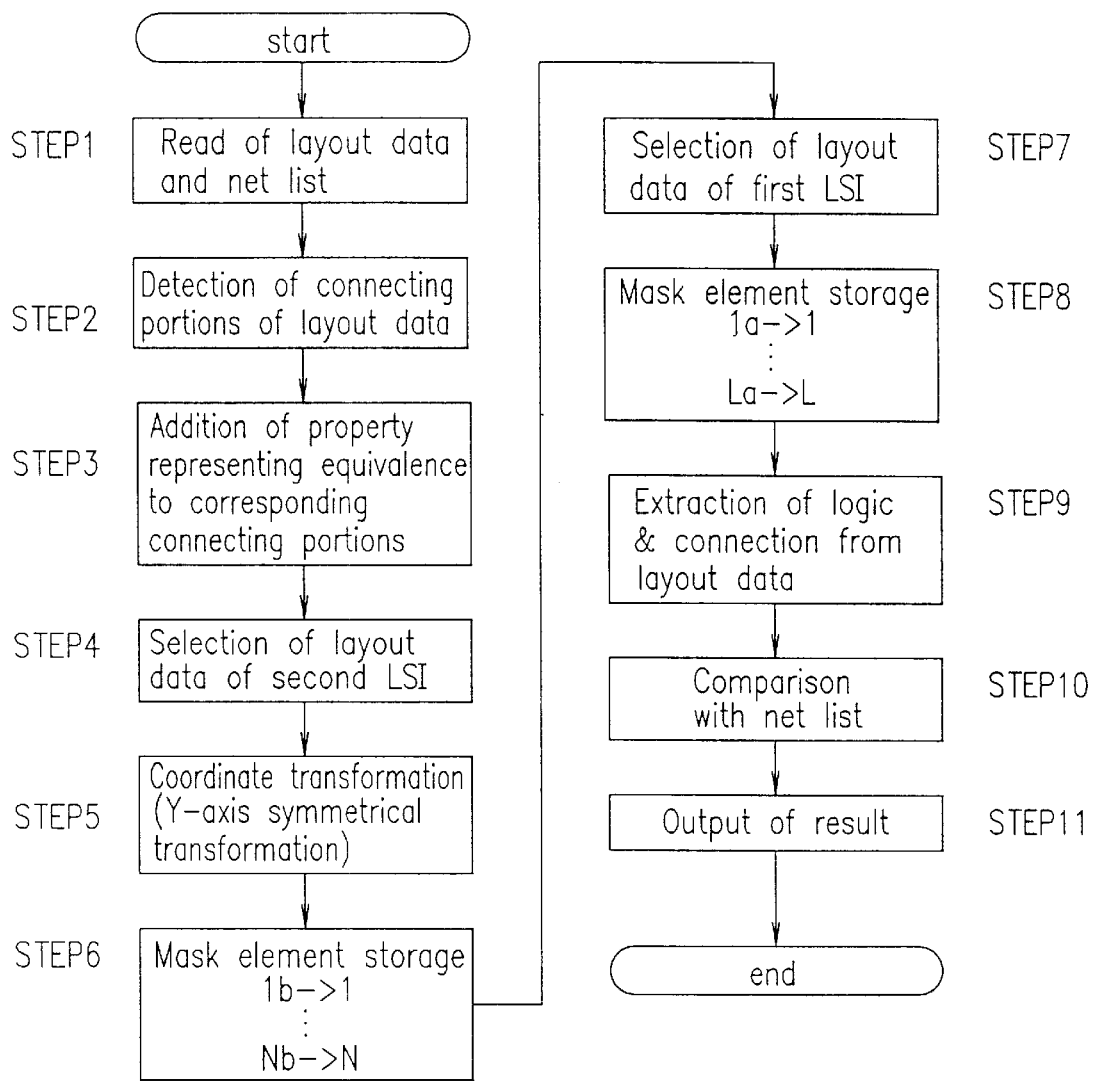
FIG. 21 is a flow chart showing an operation procedure of the layout verification apparatus in the case of conducting an LVS.

FIG. 21 shows an operation procedure of the layout verification apparatus in the case where the LVS is conducted by performing the coordinate transformation with respect to the layout data 2006 of the second LSI.

In STEP 1, the CPU 1 reads the layout data 2005 through 2007 and the net list 2008 stored in the data storing section 7. The layout data 2005 through 2007 are formed, for example, in accordance with a GDS2 format. The CPU 1 loads the layout data 2005 through 2007 in the RAM 5. Similarly, the CPU 1 loads the net list 2008 in the RAM 5.

In STEP 2 and STEP 3, the CPU 1 detects the connecting portions between the layout of the first LSI and the layout of the second LSI, using the connecting portions of layout detection program 2003 stored in the ROM 6. STEP 4 through STEP 11 are discussed in greater detail below.

Figure 22:
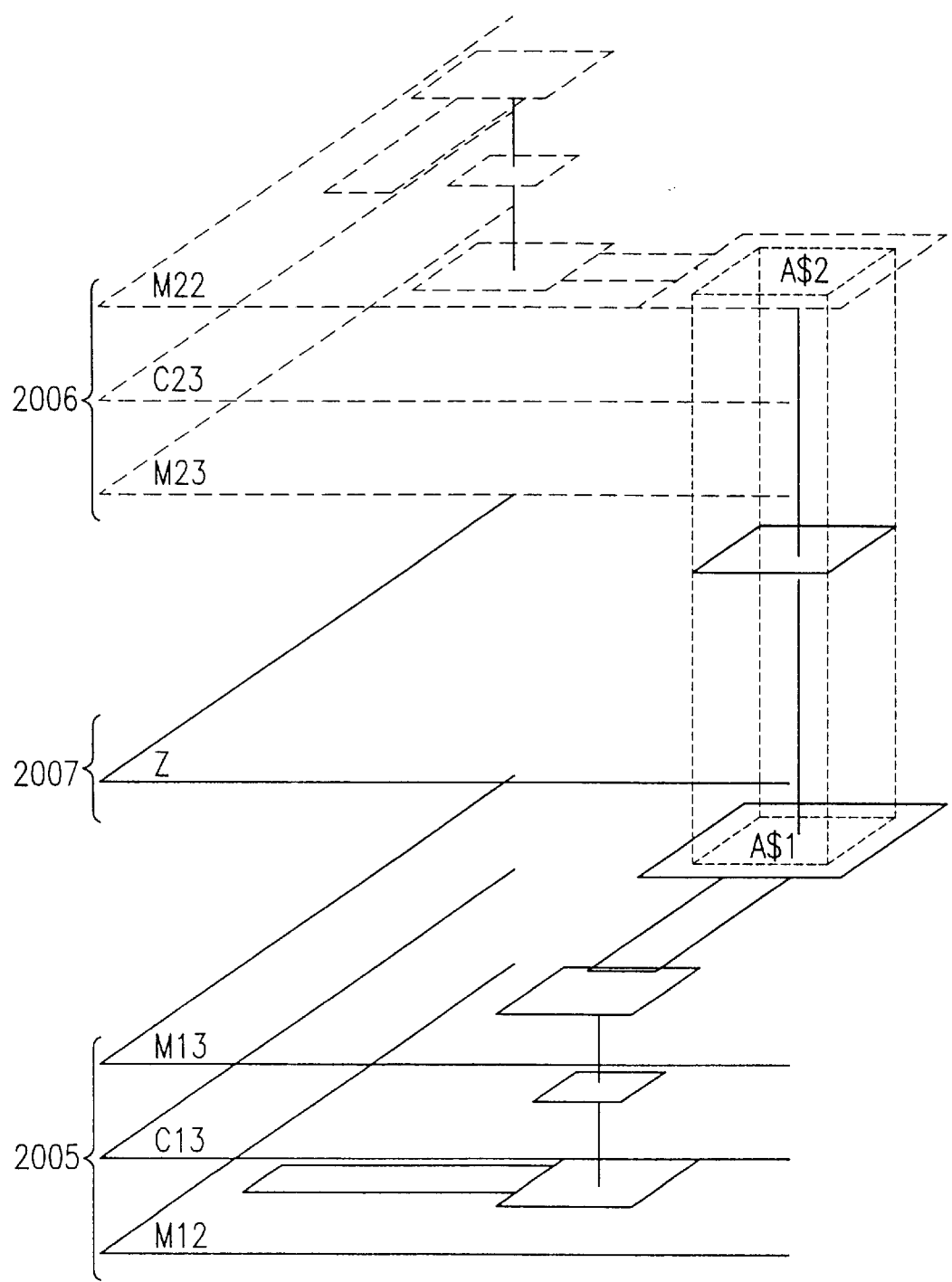
FIG. 22 shows a structure of layout data 2005 through 2007.

FIG. 22 shows a structure of the layout data 2005 of the first LSI, a structure of the layout data 2006 of the second LSI, and a structure of the layout data 2007 defining the connecting portions between the first LSI and the second LSI. In an example shown in FIG. 22, the layout data 2005 includes a wiring layer M12, a contact layer C13 and a wiring layer M13. The layout data 2006 includes a wiring layer M22, a contact layer C23 and a wiring layer M23. The layout data 2007 includes a connecting layer Z.

The CPU 1 executes the following steps 1) through 5) in accordance with the connecting portions of layout detection program 2003.

1) An uppermost layer M13 of the first LSI superposed on the pattern of the connecting layer Z of the layout data 2007 is retrieved.

2) A property "A$1" is added to the pattern of a most significant layer M13 of the layout data 2005 superposed on the pattern of the connecting layer Z of the layout data 2007. For example, in the case where the pattern of the most significant layer M13 is a rectangle, the property "A$1" is added to the center of the rectangle.

3) A most significant layer M23 of the second LSI superposed on the pattern of the connecting layer Z of the layout data 2007 is retrieved.

4) A property "A$2" is added to the pattern of the most significant layer M23 of the layout data 2006 superposed on the pattern of the connecting layer Z of the layout data 2007. For example, in the case where the pattern of the most significant layer M23 is a rectangle, the property "A$2" is added to the center of the rectangle.

5) The information specifying the layers to which the properties are added and the coordinate information representing the positions in the layers where the properties are added are stored in the RAM 5 as property information.

A layer to which a property is added is not limited to the most significant layer. The property can be added to any layer included in a plurality of layers of the layout data.

FIG. 23 shows an example of property information stored in the RAM 5. For example, FIG. 23 shows that a property having a property name "A" is commonly added to coordinate (100, 100) of the wiring layer M13 of the first LSI and coordinate (100, 100) of the wiring layer M23 of the second LSI. In the layout verification processings in STEP 9 and STEP 10 described later, it is considered that the point of the first LSI and the point of the second LSI to which the common property is added are electrically equivalent (i.e., electrically connected). For example, in FIG. 22, it is considered that the point to which the property "A$1" is added and the point to which the property "A$2" is added are electrically equivalent. Preferably, the position of the connecting portions, the position of the point to which the property "A$1" is added, and the position of the point to which the property "A$2" is added are represented by the identical coordinate.

Returning back to FIG. 21, in STEP 4, the CPU 1 selects the layout data 2006 of the second LSI.

Figure 24:
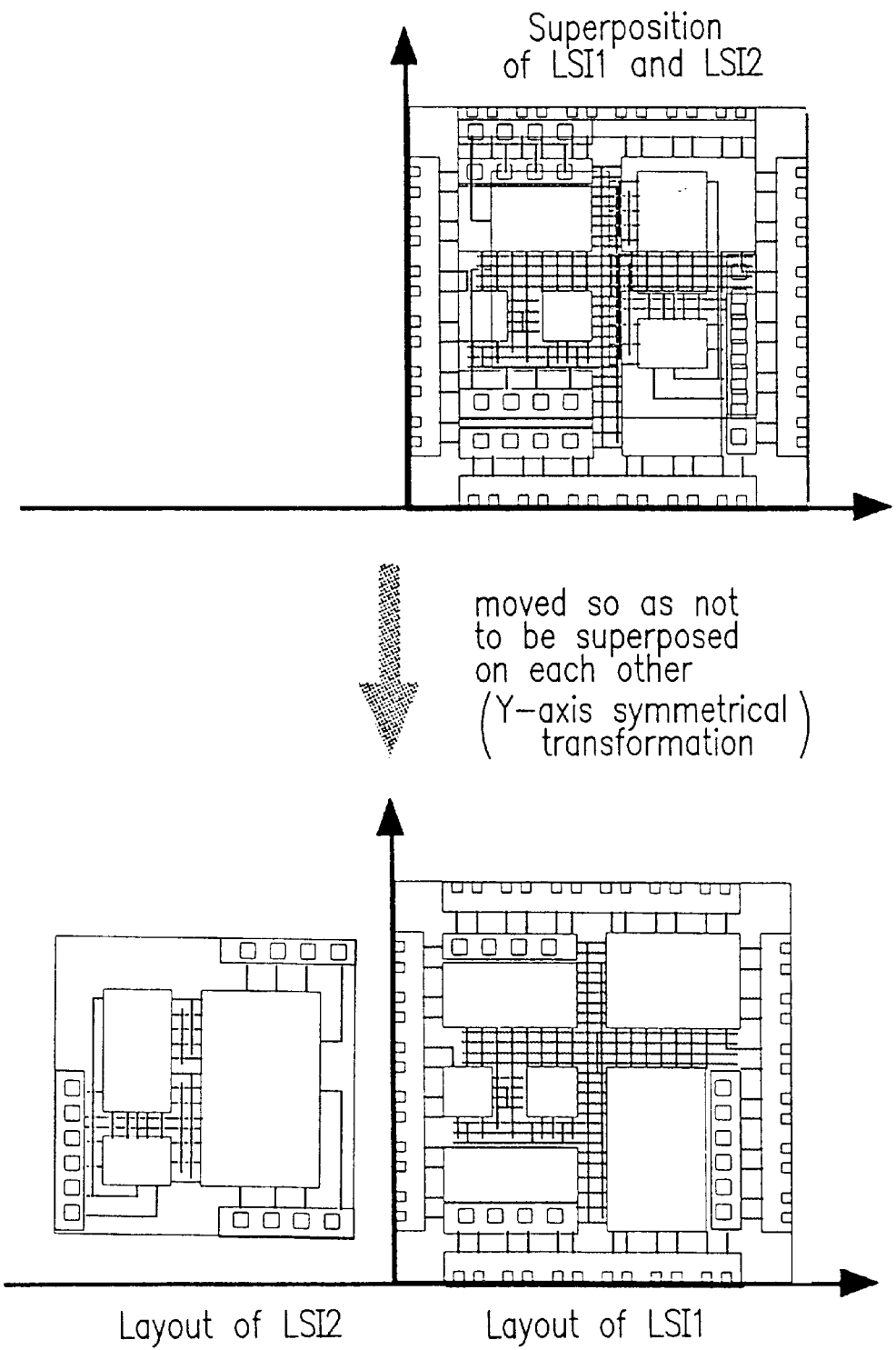
FIG. 24 is a view showing the changes in layout graphic by Y-axis symmetrical transformation.

In STEP 5, the CPU 1 performs the Y-axis symmetrical transformation shown in FIG. 24 by using the coordinate transformation program 2004 stored in the ROM 6.

Figure 25:
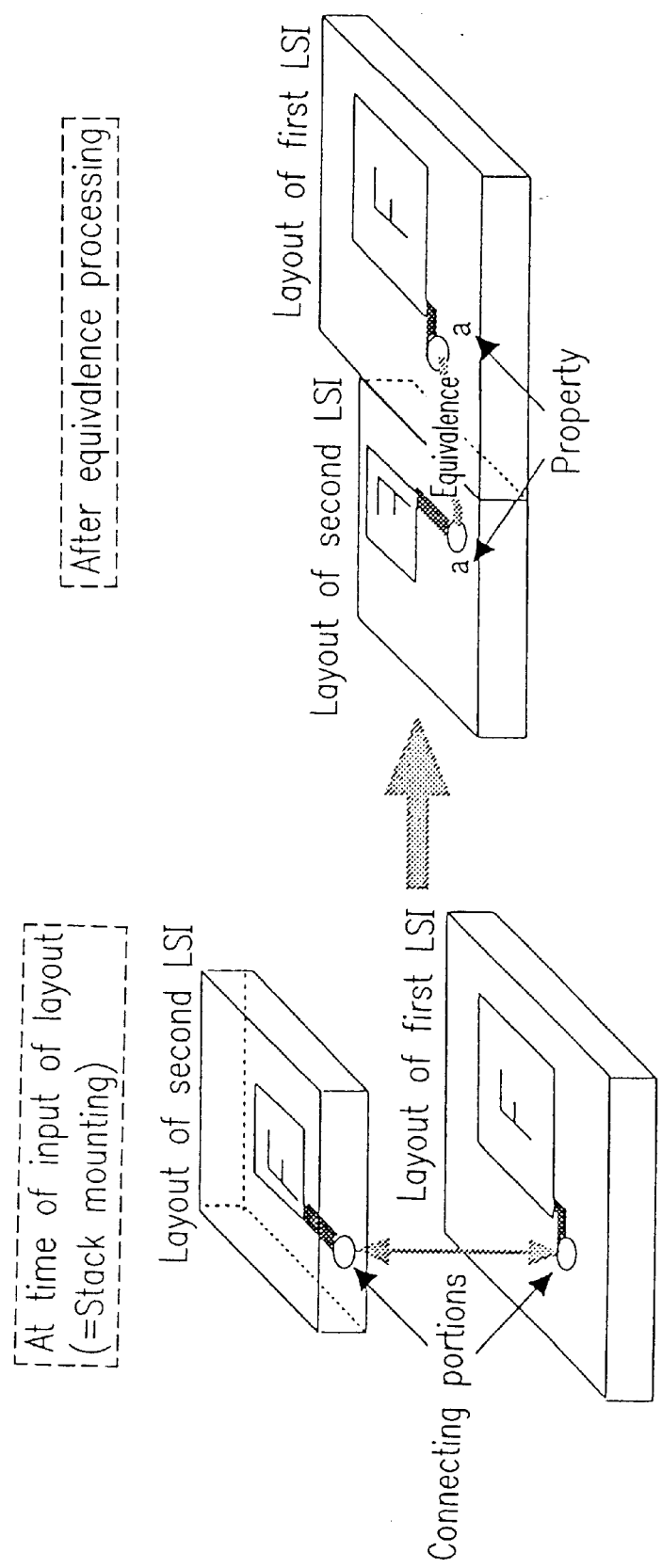
FIG. 25 shows images of a layout equivalence processing.

In the case where a square on a plane is represented by the following coordinates of two vertices thereof: (10, 10) and (20, 20), the coordinates of two vertices of the square after the Y-axis symmetrical transformation are given by (−10, 10) and (−20, 20). The coordinate in the property information detected in STEP 3 is also subjected to the Y-axis symmetrical transformation. It should be noted that such a coordinate transformation is not limited to the Y-axis symmetrical transformation. As long as the layout data 2005 of the first LSI and the layout data 2006 of the second LSI are arranged so as not to be superposed on each other on the identical coordinate system, any coordinate transformation can be adopted in place of the Y-axis symmetrical transformation. FIGS. 24 and 25 show images of the processings of STEP 2 through STEP 5.

Figure 26:
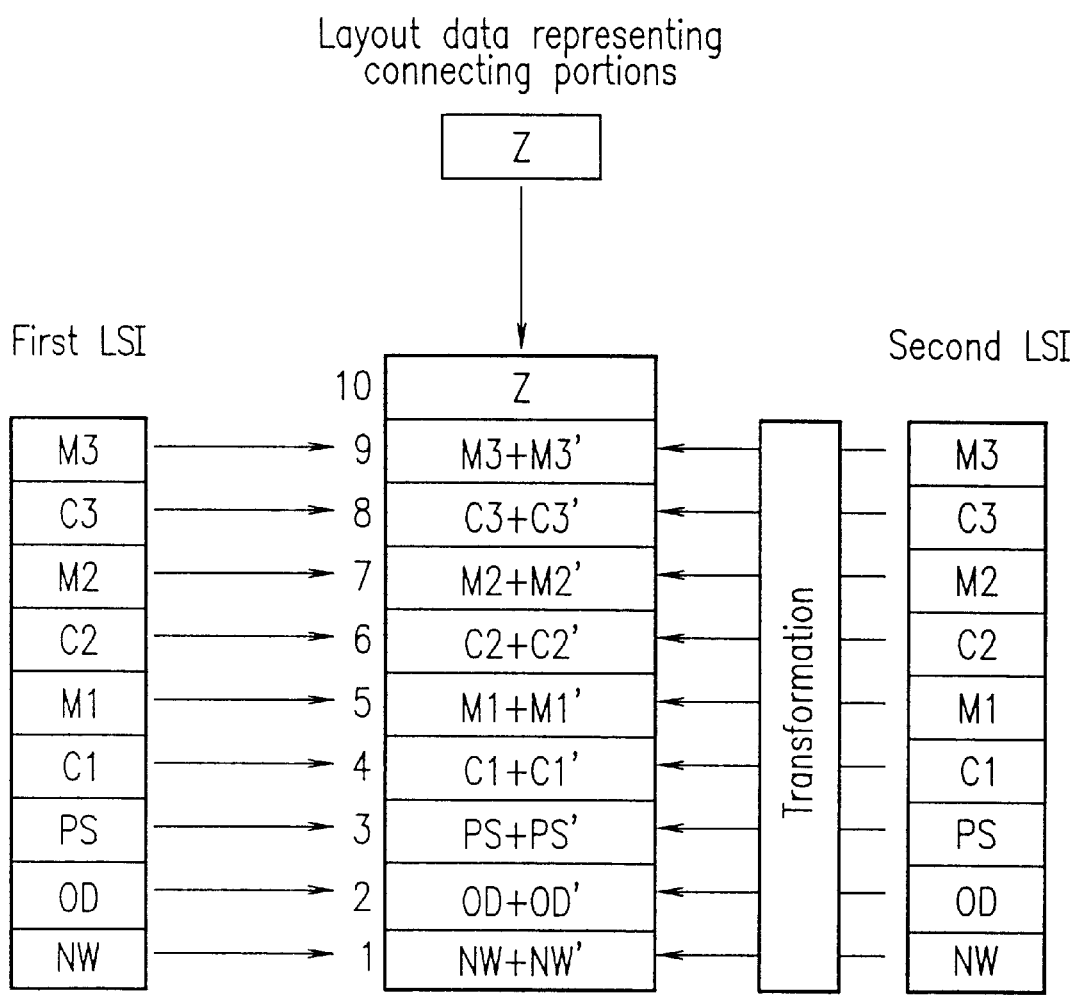
FIG. 26 is a diagram showing the corresponding relationship between the mask elements and the standard mask element No.

In STEP 6, the CPU 1 stores each mask element of the layout data 2006 of the second LSI which is subjected to coordinate transformation in STEP 5 in the position specified by the standard mask element Nos. 1 through 9, using the storage program 2001 stored in the ROM 6. The corresponding relationship between the mask elements and the standard mask element No. is previously determined, for example, as shown in FIG. 26.

In STEP 7, the CPU 1 selects the layout data 2005 of the first LSI.

In STEP 8, the CPU 1 stores each mask element of the layout data 2005 of the first LSI in the position specified by the standard mask element Nos. 1 through 9, using the storage program 2001 stored in the ROM 6. The corresponding relationship between the mask elements and the standard mask element No. is previously determined, for example, as shown in FIG. 26.

The "standard mask element No." refers to the information representing the position where each mask element (two-dimensional input layer) is stored. Nos. 1 through 10 shown in FIG. 26 correspond to the standard mask element Nos. 1 through 10. For example, the standard mask element No. 1 represents the number of a mask element of a well layer, and the standard mask element No. 5 represents the number of a mask element of a first wiring layer.

In STEP 9 and STEP 10, the CPU 1 executes the layout verification processing, using the mask element of the layout data 2005 and the mask element of the layout data 2006 stored in the identical standard mask element No. in STEP 6 and STEP 8 as one processing unit. For example, the CPU 1 extracts a logic and connection from the layout by using the logic verification program 2002 stored in the ROM 6 with respect to such one processing unit, and compares the layout data 2005 and 2006 with the net list 2008.

In FIG. 26, a sign "+" refers to an OR operation. For example, the CPU 1 conducts an OR operation of a mask element NW of the first LSI and a mask element NW' obtained by performing the coordinate transformation with respect to a mask element NW of the second LSI, thereby executing the layout verification processing, using the mask element NW and the mask element NW' as one processing unit. The same can be applied to other mask elements. Furthermore, the CPU 1 executes the layout verification processing, considering that the point of the first LSI to which the common property is added and the second LSI are connected to each other.

In STEP 11, the CPU 1 outputs the result of the layout logic verification.

Figure 27:
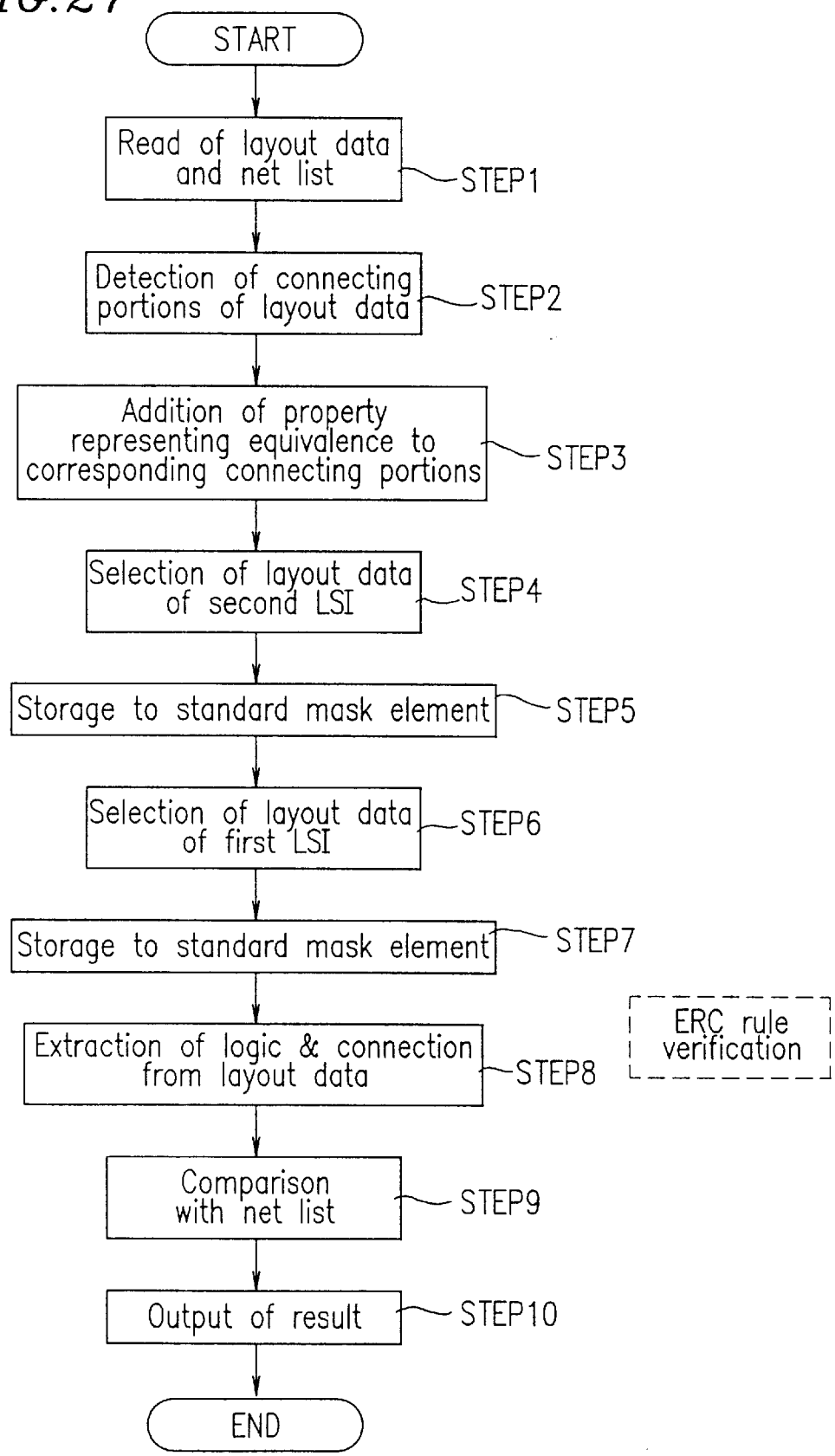
FIG. 27 is a flow chart showing an operation procedure of the layout verification apparatus in the case of conducting an LVS.

FIG. 27 shows an operation procedure of the layout verification apparatus in the case where the LVS is conducted without performing the coordinate transformation.

STEP 1 through STEP 3 are the same as those in FIG. 21, so that the description thereof will be omitted.

In STEP 4, the CPU 1 selects the layout data 2006 of the second LSI.

In STEP 5, the CPU 1 stores each mask element of the layout data 2006 of the second LSI in the position designated by the standard mask element Nos. 11 through 19, using the storage program 2001 stored in the ROM 6. The corresponding relationship between the mask elements and the standard mask element No. is previously determined, for example, as shown in FIG. 28.

In STEP 6, the CPU 1 selects the layout data 2005 of the first LSI.

In STEP 7, the CPU 1 stores each mask element of the layout data 2005 of the first LSI in the position specified by the standard mask element Nos. 1 through 9, by using the storage program 2001 stored in the ROM 6. The corresponding relationship between the mask elements and the standard mask element No. is previously determined, for example, as shown in FIG. 28.

In STEP 8 and STEP 9, the logic verification program 2002 stored in the ROM 6 extracts a logic and connection from each layout, using an "extraction function of recognition and connection of transistors" corresponding to each layout of the first and second LSIs, and compares the layout data 2005 and 2006 with the net list 2008.

In STEP 10, the CPU 1 outputs the result of the layout logic verification.

In order to apply the layout verification apparatus of the present invention to the ERC, in STEP 9 and STEP 10 in FIG. 21, the extraction of a logic and connection from a layout should be conducted by using the ERC verification program 2009 in place of the logic verification program 2002, and the electrical connection verification, such as "floating of a gate of a transistor", "short of an output of a transistor", "floating of a wiring", "short of a wiring", and "relationship between the transistor and the power supply" should be conducted.

Alternatively, in STEP 8 and STEP 9 in FIG. 27, the extraction of a logic and connection from a layout may be conducted using the ERC verification program 2009 in place of the logic verification program 2002.

Next, the case where the layout verification apparatus of the present invention is applied to the DRC will be described.

Figure 29:
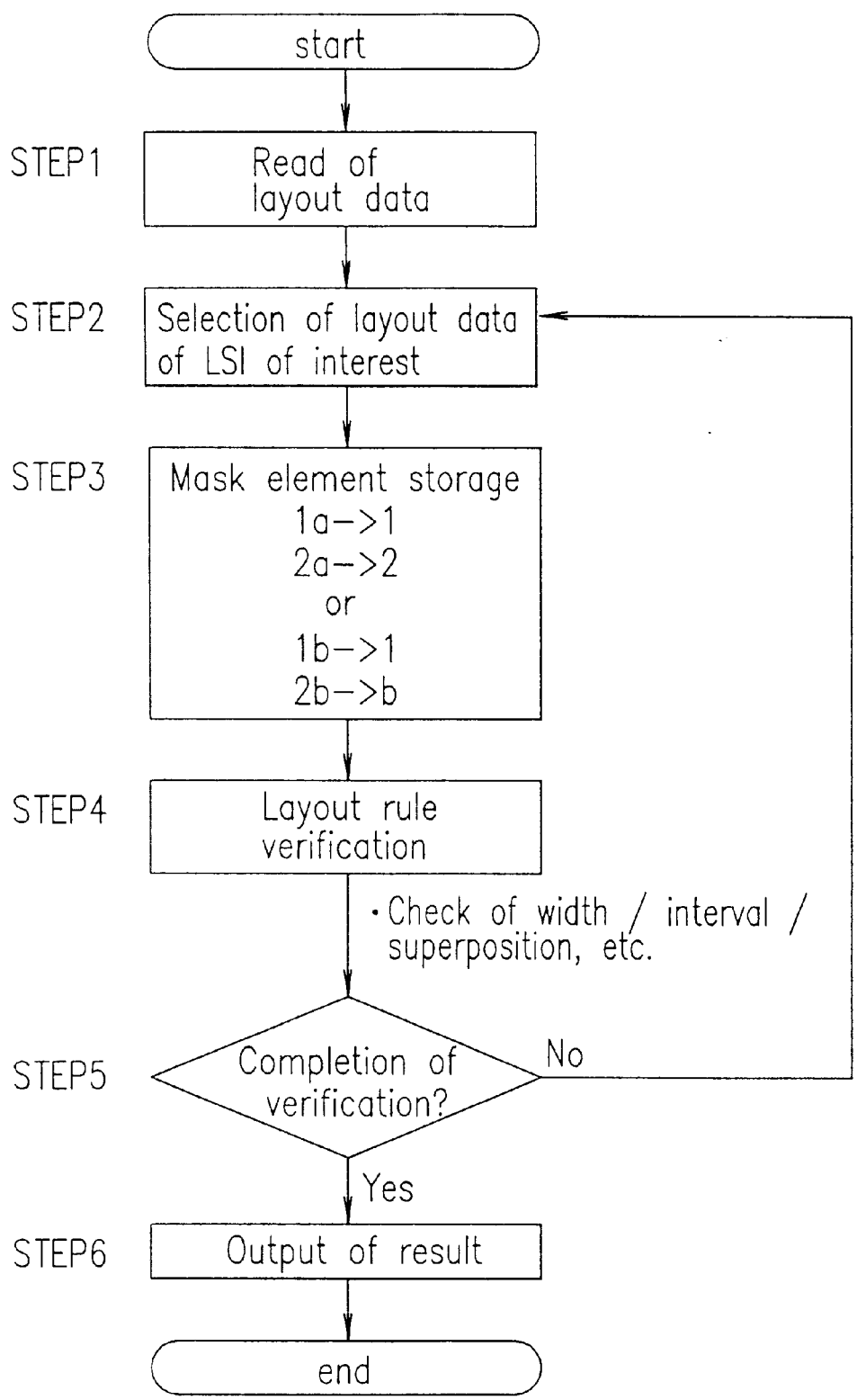
FIG. 29 is a flow chart showing an operation procedure of the layout verification apparatus in the case of conducting a DRC.

FIG. 29 shows an operation procedure of the layout verification apparatus in the case of conducting the DRC.

In STEP 1, the CPU 1 reads the layout data 2005 through 2007 stored in the data storing section 7. The layout data 2005 through 2007 are formed, for example, in accordance with a GDS2 format. The CPU 1 loads the layout data 2005 through 2007 in the RAM 5.

In STEP 2, the CPU 1 selects either one of the layout data 2005 of the first LSI and the layout data 2006 of the second LSI by using the selection program 2010 stored in the ROM 6.

Figure 30:
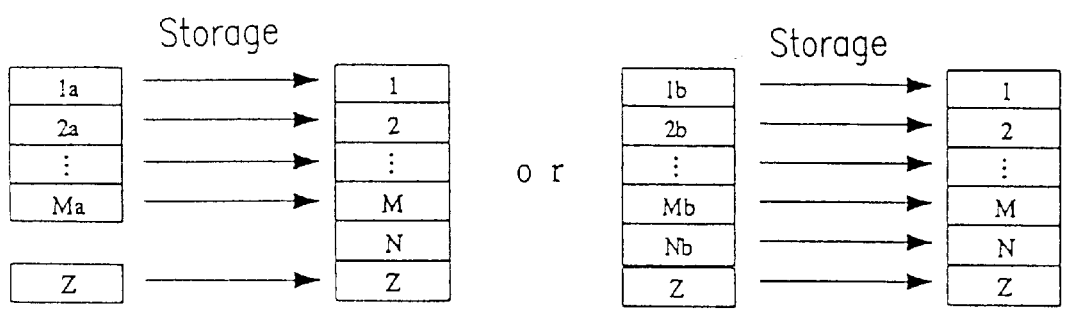
FIG. 30 is a diagram showing the corresponding relationship between the mask elements and the standard mask element No.

In STEP 3, the CPU 1 stores the mask elements included in the layout data of the LSI selected in STEP 2 and the layout data 2007 representing the connecting portions in the position specified by the standard mask element No., using the storage program stored in the ROM 6. The corresponding relationship between the mask elements and the standard mask element No. is previously determined, for example, as shown in FIG. 30.

The "standard mask element No." refers to the information representing the position where each mask element (two-dimensional input layer) is stored. The numbers (1, 2, M, N, and Z) shown in FIG. 30 correspond to the standard mask element No. For example, the standard mask element No. 1 represents the number of a mask element of a well layer, and the standard mask element No. 5 represents the number of a mask element of a first wiring layer.

In STEP 4, the CPU 1 verifies the design rule related to items such as a wiring width, a wiring interval and superposition with respect to each mask element, using the design rule verification program 2011 stored in the ROM 6.

In STEP 5, the CPU 1 judges whether or not the processing with respect to the first and second LSIs is completed. In the case where the processing is not completed, the CPU 1 returns to STEP 2 to select data of the LSI which has not been processed. In the case where the processing is completed, the CPU 1 proceeds to STEP 6.

In STEP 6, the CPU 1 outputs the result of the design rule verification.

Figure 31:
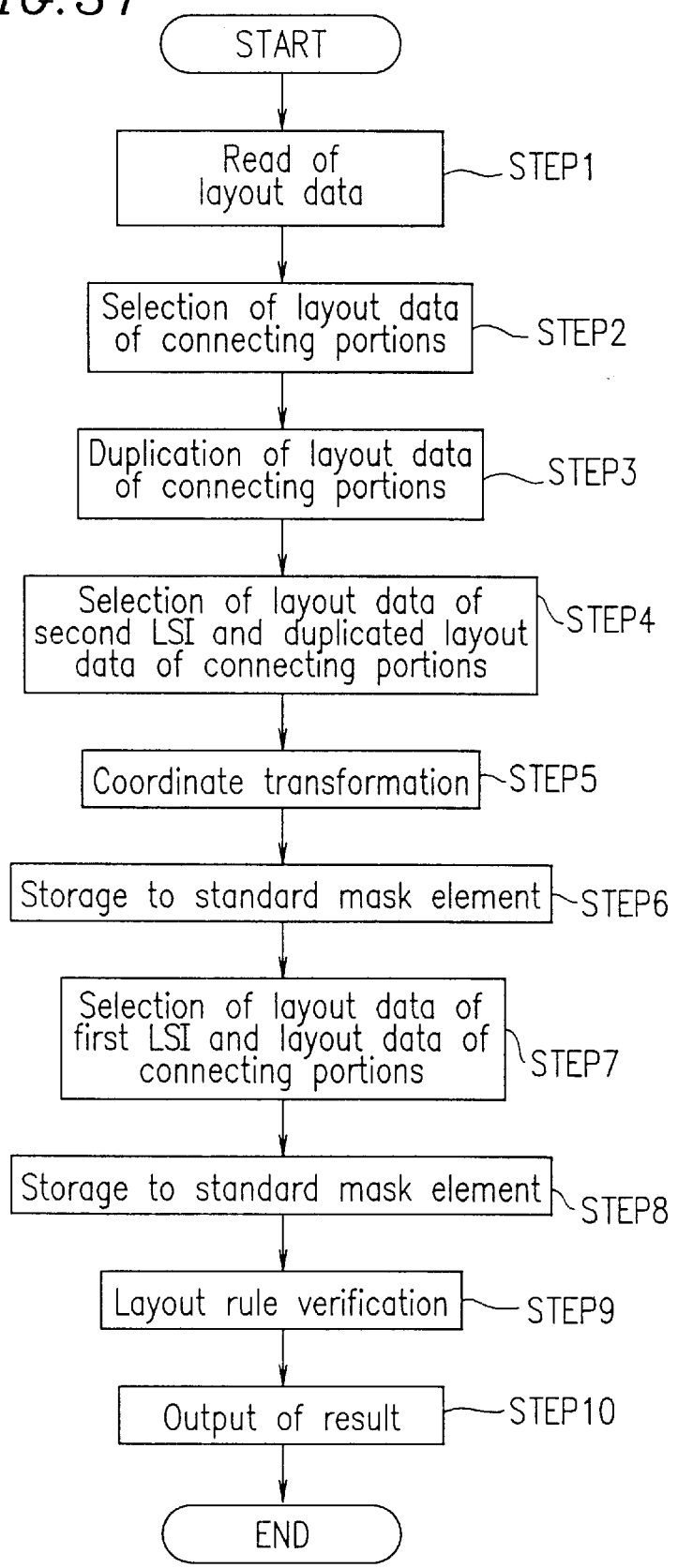
FIG. 31 is a flow chart showing an operation procedure of the layout verification apparatus in the case of conducting a DRC.

FIG. 31 shows an operation procedure of the layout verification apparatus in the case where the DRC is conducted by performing the coordinate transformation with respect to the layout data 2006 of the second LSI and the duplicated data of the layout data 2007.

In STEP 1, the CPU 1 reads the layout data 2005 through 2007 stored in the data storing section 7.

In STEP 2 and STEP 3, the CPU 1 duplicates the layout data 2007 defining the connecting portions between the layout of the first LSI and the layout of the second LSI by using the duplication program 2012 stored in the ROM 6 and stores the duplicated data of the layout data 2007 in the RAM 5.

In STEP 4, the CPU 1 selects the duplicated data of the layout data 2007 and the layout data 2006 of the second LSI.

In STEP 5, the CPU 1 performs the Y-axis symmetrical transformation with respect to the data selected in STEP 4, using the coordinate transformation program 2004 stored in the ROM 6. Regarding the Y-axis symmetrical transformation, see FIG. 24.

In the case where a square on a plane is represented by the following coordinates of two vertices thereof: (10, 10) and (20, 20), the coordinates of two vertices of the square after the Y-axis symmetrical transformation are given by (−10, 10) and (−20, 20). FIG. 25 shows an image of the processing in STEP 5.

Figure 32:
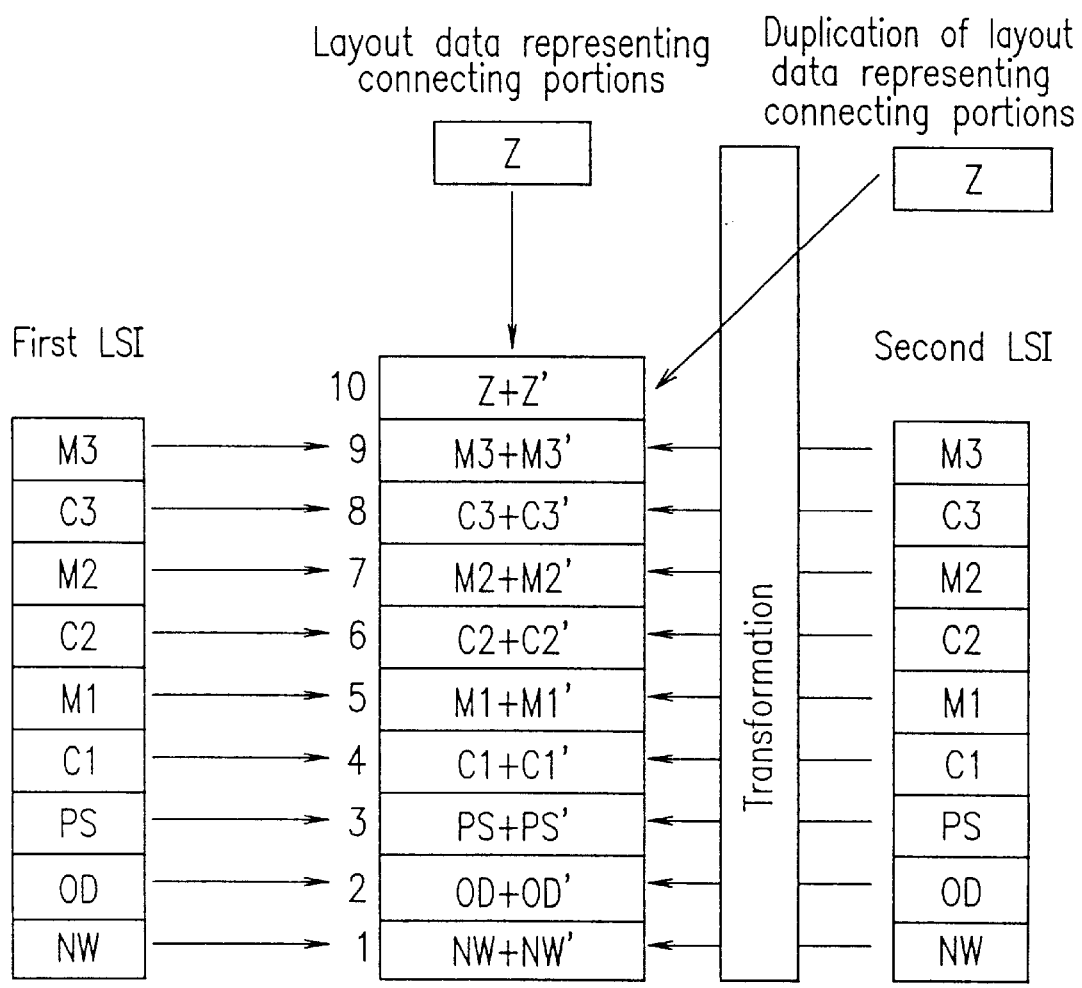
FIG. 32 is a diagram showing the corresponding relationship between the mask elements and the standard mask element No.

In STEP 6, the CPU 1 stores each mask element of the duplicated data of the layout data 2007 which is subjected to the coordinate transformation in STEP 5 and the layout data 2006 of the second LSI in the position specified by the standard mask element No., using the storage program 2001 stored in the ROM 6. The corresponding relationship between the mask elements and the standard mask element No. is previously determined, for example, as shown in FIG. 32.

In STEP 7, the CPU 1 selects the layout data 2007 and the layout data 2005 of the first LSI.

In STEP 8, the CPU 1 stores each mask element of the layout data 2007 and the layout data 2005 of the first LSI in the position specified by the standard mask element No., using the storage program 2001 stored in the ROM 6. The corresponding relationship between the mask elements and the standard mask element No. is previously determined, for example, as shown in FIG. 32.

The "standard mask element No." refers to the information representing the position where each mask element (i.e., two-dimensional input layer) is stored. Nos. 1 through 10 shown in FIG. 32 correspond to the standard mask element Nos. 1 through 10. For example, the standard mask element No. 1 represents the number of a mask element of a well layer, and the standard mask element No. 5 represents the number of a mask element of a first wiring layer.

In STEP 9, the CPU 1 executes the layout verification processing, using the layout data 2007 and its duplicated data stored in the identical standard mask element No. in STEP 6 and STEP 8 as one processing unit. The CPU 1 also executes the layout verification processing, using the mask element of the layout data 2005 and the mask element of the layout data 2006 stored in the identical standard mask element No. in STEP 6 and STEP 8 as one processing unit. More specifically, the CPU 1 verifies the design rule related to items such as a wiring width, a wiring interval, and superposition with respect to each mask element, using the design rule verification program 2011 stored in the ROM 6 with respect to such one processing unit.

In STEP 10, the CPU 1 outputs the result of the design rule verification.

Figure 33:
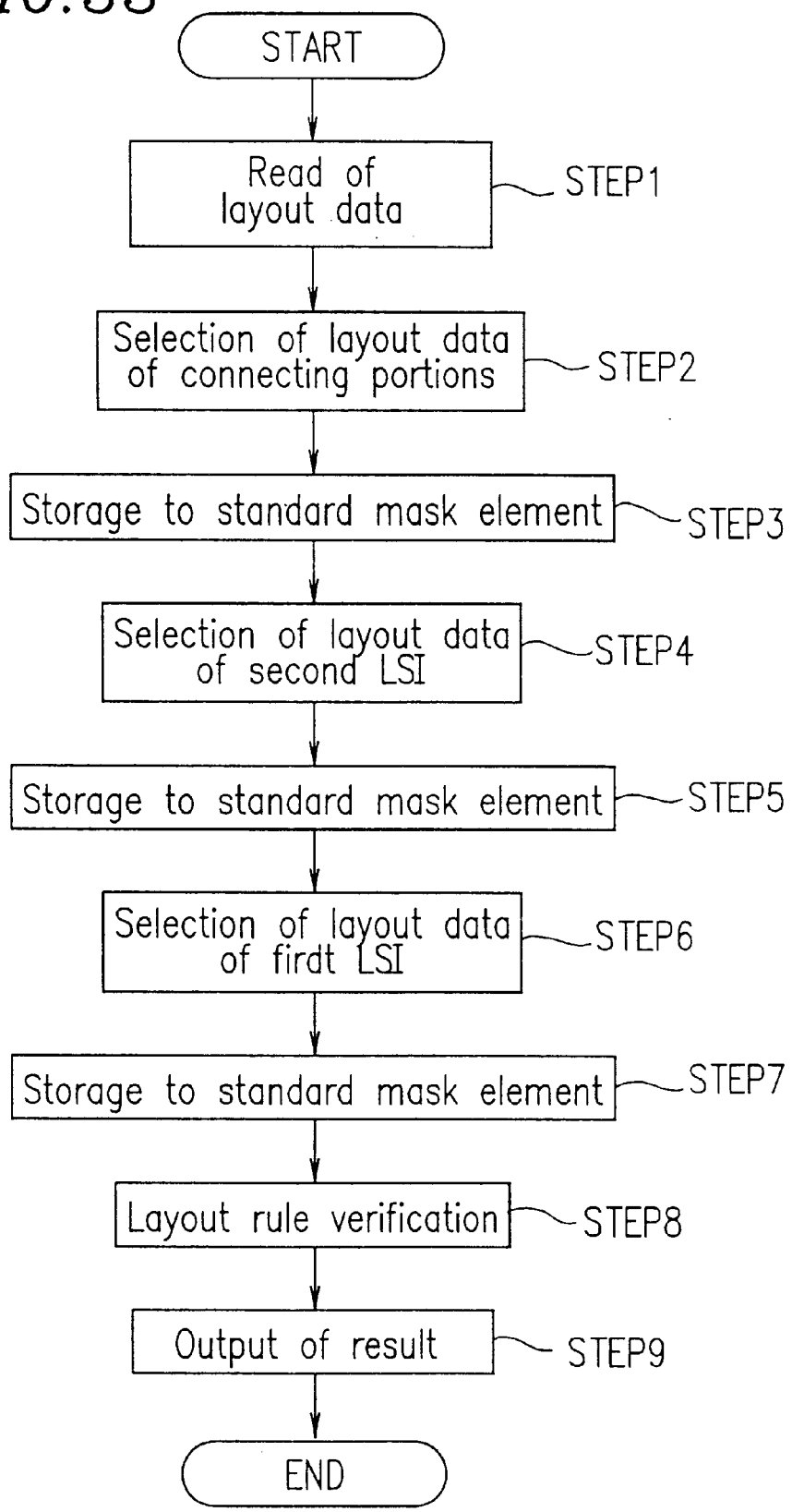
FIG. 33 is a flow chart showing an operation procedure of the layout verification apparatus in the case of conducting a DRC.
Figure 34C:
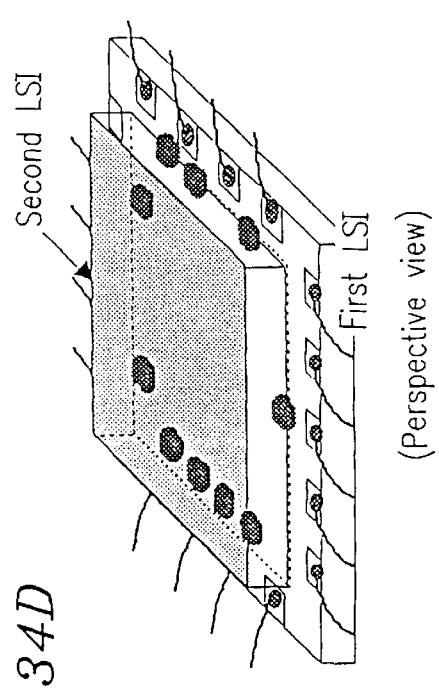
FIG. 34C is a plan view showing the state in which two LSI chips are mounted.
Figure 34A:
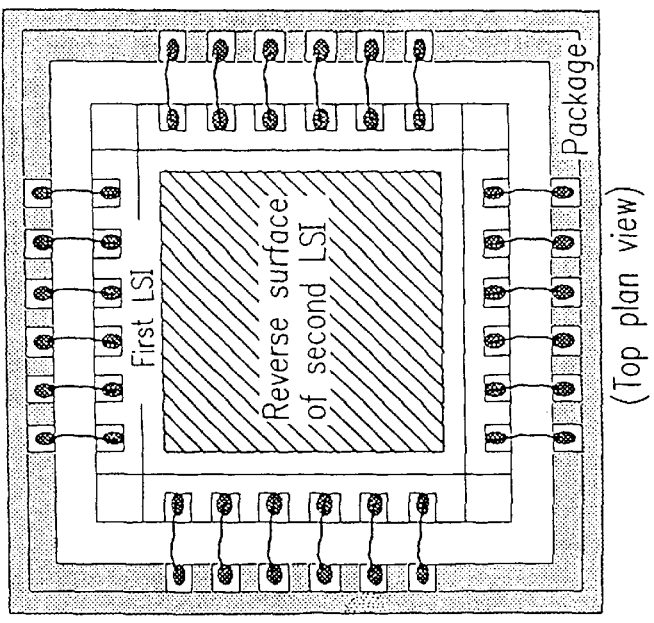
FIG. 34A is a plan view showing connecting portions of two LSI chips for Flip & Stack mounting.
Figure 34D:
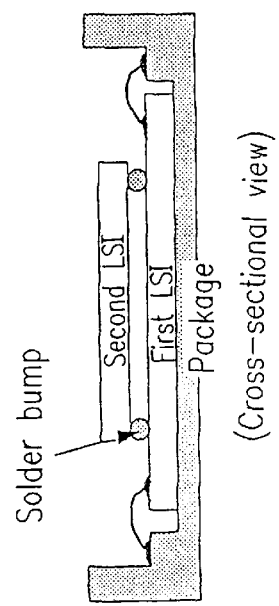
FIG. 34D is a perspective view showing the state in which two LSI chips are mounted.
Figure 34B:
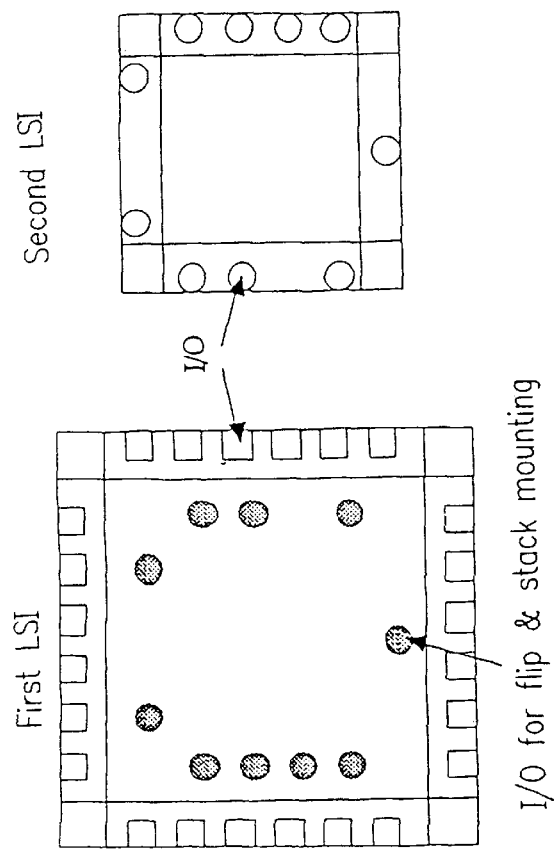
FIG. 34B is a cross-sectional view showing the state two LSI chips are mounted.

FIG. 33 shows an operation procedure of the layout verification apparatus in the case where the DRC is conducted without performing the coordinate transformation.

In STEP 1, the CPU 1 reads the layout data 2005 through 2007 stored in the data storing section 7.

In STEP 2, the CPU 1 selects the layout data 2007.

In STEP 3, the layout data 2007 is stored in the position specified by the standard mask element No. 10, using the storage program 2001 stored in the ROM 6 (see FIG. 28).

In STEP 4, the CPU 1 selects the layout data 2006 of the second LSI.

In STEP 5, the CPU 1 stores each mask element of the layout data 2006 of the second LSI in the position specified by the standard mask element Nos. 11 through 19, using the storage program 2001 stored in the ROM 6. The corresponding relationship between the mask elements and the standard mask element No. is previously determined as shown in FIG. 28.

In STEP 6, the CPU 1 selects the layout data 2005 of the first LSI.

In STEP 7, the CPU 1 stores each mask element of the layout data 2005 of the first LSI in the position specified by the standard mask element Nos. 1 through 9, using the storage program 2001 stored in the ROM 6. The corresponding relationship between the mask elements and the standard mask element No. is previously determined as shown in FIG. 28.

In STEP 8, the design rule verification program 2011 stored in the ROM 6 verifies the design rule related to the items such as a wiring width, a wiring interval, and superposition with respect to each mask element, in accordance with the design rule corresponding to each of the layouts of the first and second LSIs.

In STEP 9, the CPU 1 outputs the result of the layout logic verification.

The layout input apparatus and the layout input method according to the present invention allows the layouts of a plurality of LSIs to be simultaneously input in the course of the layout design. Therefore, the mutual influence on the layouts due to the changes in arrangement of the connecting portions of two LSIs can be grasped at a glance and steps can be taken immediately. This enables the design period to be shortened and layouts to be optimized (i.e., highly integrated).

Furthermore, the layout verification apparatus and the layout verification method according to the present invention enables the layouts of a plurality of LSIs to be simultaneously verified. Therefore, the rule check of the connecting portions, which has been manually conducted in the past, can be conducted in accordance with a program in a short period of time with accuracy. This shortens the design period. In the layout logic verification, the logic verification can be conducted by using a net list of the combination of a plurality of LSIs. Therefore, the number of steps of forming net lists and the number of data are decreased, resulting in the decrease in the number of steps of data management.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A layout input apparatus, comprising:
    an input section for inputting first coordinate information representing a position of a first circuit portion included in a first semiconductor integrated circuit and second coordinate information representing a position of a second circuit portion included in a second semiconductor integrated circuit;
    a control section for performing a predetermined coordinate transformation with respect to the second coordinate information;
    a storage section for storing the first coordinate information as at least a part of first layout data representing a layout of the first semiconductor integrated circuit and storing the transformed second coordinate information as at least a part of second layout data representing a layout of the second semiconductor integrated circuit; and
    a display section for displaying the first and the second coordinate information so as to overlap at least partially;
    wherein the first semiconductor integrated circuit is formed on a first surface of a first semiconductor chip;
    the second semiconductor integrated circuit is formed on a second surface of a second semiconductor chip;
    the first semiconductor chip and the second semiconductor chip are mounted so as to overlap in such a manner so that the first surface and the second surface are formed to face each other; and
    wherein the control section transfers to the storage section the first coordinate information and the transformed second coordinate information; and
    the control section transfers to the display section the first coordinate information and the second coordinate information.

2. A layout input apparatus according to claim 1, wherein the control section performs the predetermined coordinate transformation when the second coordinate information is stored in the storage section.

3. A layout input apparatus according to claim 1, wherein the control section performs the predetermined coordinate transformation in response to the input of the second coordinate information.

4. A layout input apparatus according to claim 1, wherein the predetermined coordinate transformation includes a symmetrical transformation with respect to a predetermined axis.

5. A layout input apparatus according to claim 4, wherein the predetermined coordinate transformation further includes a parallel movement along a predetermined direction.

6. A layout input apparatus according to claim 1, wherein a first coordinate system for the first layout data is different from a second coordinate system for the second layout data.

7. A layout input apparatus according to claim 6, wherein each of the first coordinate system and the second coordinate system has an X-axis and a Y-axis, and an origin in the first coordinate system is shifted from an origin in the second coordinate system by a predetermined X-offset in a direction of the X-axis and by a predetermined Y-offset in a direction of the Y-axis.

8. A layout input apparatus according to claim 7, wherein the predetermined Y-offset is 0.

9. A layout input apparatus according to claim 7, wherein the predetermined X-offset is 0 and the predetermined Y-offset is 0.

10. A layout input method, comprising the steps of:

inputting first coordinate information representing a position of a first circuit portion included in a first semiconductor integrated circuit and second coordinate information representing a position of a second circuit portion included in a second semiconductor integrated circuit;

performing a predetermined coordinate transformation with respect to the second coordinate information;

storing the first coordinate information as at least a part of first layout data representing a layout of the first semiconductor integrated circuit and storing the transformed second coordinate information as at least a part of second layout data representing a layout of the second semiconductor integrated circuit; and displaying the first and the second coordinate information so as to overlap at least partially;

wherein the first semiconductor integrated circuit is formed on a first surface of a first semiconductor chip;

the second semiconductor integrated circuit is formed on a second surface of a second semiconductor chip;

the first semiconductor chip and the second semiconductor chip are mounted so as to overlap in such a manner so that the first surface and the second surface are formed to face each other; and wherein the first coordinate information and the transformed second coordinate information are transferred to a storage section for carrying out the storing step; and the first coordinate information and the second coordinate information are transferred to a display section for carrying out the displaying step.

11. A layout verification apparatus, comprising:

a storage section for storing first layout data representing a layout of a first semiconductor integrated circuit, second layout data representing a layout of a second semiconductor integrated circuit which is different from the first semiconductor integrated circuit, and connection information defining a position of a connection portion connecting the first semiconductor integrated circuit to the second semiconductor integrated circuit; and a control section for specifying a first position in the first layout data corresponding to the position of the connection portion and a second position in the second layout data corresponding to the position of the connecting portion, based on the connection information, and verifying the layouts of the first and second semiconductor integrated circuits, considering that the first position is connected to the second position, wherein the first and second semiconductor integrated circuits are separately formed on discrete substrates.

12. A layout verification apparatus according to claim 11, wherein the position of the connecting portion, the first position, and the second position are represented by an identical coordinate.

13. A layout verification apparatus according to claim 11, wherein the first layout data includes a plurality of first layers, and the second layout data includes a plurality of second layers; and the first position is provided in a first layer of the plurality of the first layers in which the connecting portion is formed, and the second position is provided in a second layer of the plurality of second layers in which the connecting portion is formed.

14. A layout verification apparatus according to claim 11, wherein the first layer in which the connecting portion is formed is a most significant layer of the plurality of first layers, and the second layer in which the connecting portion is formed is a most significant layer of the plurality of second layers.

15. A layout verification apparatus according to claim 11, wherein the control section positions the first layout data and the second layout data in such a manner that the first layout data is not superposed on the second layout data on an identical coordinate system, and executes a verification processing, using the first layer included in the first layout data and the second layer included in the second layout data as one processing unit.

16. A layout verification apparatus according to claim 11, wherein the control section compares the first and second layout data with a net list.

17. A layout verification apparatus according to claim 11, wherein the control section verifies an open/short between an input and an output of a logical element represented by the first and second layout data.

18. A layout verification method verifying layouts of first and second semiconductor integrated circuits, based on first layout data representing the layout of a first semiconductor integrated circuit, second layout data representing the layout of a second semiconductor integrated circuit which is different from the first semiconductor integrated circuit, and connection information defining a position of a connecting portion connecting the first semiconductor integrated circuit to the second semiconductor integrated circuit, comprising the steps of:

a) specifying a first position in the first layout data corresponding to the position of the connecting portion and a second position of the second layout data corresponding to the position of the connecting portion, based on the connection information; and b) verifying the layouts of the first and second semiconductor integrated circuits, considering that the first position is connected to the second position, wherein the first and second semiconductor integrated circuits are separately formed on discrete substrates.

* * * * *